US008971627B2

(12) United States Patent
Taguchi et al.

(10) Patent No.: US 8,971,627 B2
(45) Date of Patent: Mar. 3, 2015

(54) TEMPLATE MATCHING PROCESSING DEVICE AND TEMPLATE MATCHING PROCESSING PROGRAM

(75) Inventors: Jun'ichi Taguchi, Sagamihara (JP); Mitsuji Ikeda, Hitachinaka (JP); Yuichi Abe, Mito (JP); Masahiro Kitazawa, Honjo (JP); Wataru Nagatomo, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 209 days.

(21) Appl. No.: 13/696,260

(22) PCT Filed: Mar. 17, 2011

(86) PCT No.: PCT/JP2011/056444
§ 371 (c)(1),
(2), (4) Date: Jan. 9, 2013

(87) PCT Pub. No.: WO2011/138882
PCT Pub. Date: Nov. 10, 2011

(65) Prior Publication Data
US 2013/0114898 A1    May 9, 2013

(30) Foreign Application Priority Data

May 7, 2010    (JP) .................................. 2010-106936

(51) Int. Cl.
*G06K 9/00*    (2006.01)
*G06K 9/62*    (2006.01)
(Continued)

(52) U.S. Cl.
CPC .............. *G06K 9/6201* (2013.01); *G01B 11/00* (2013.01); *G01B 15/00* (2013.01); *G06K 9/6202* (2013.01);
(Continued)

(58) Field of Classification Search
None
See application file for complete search history.

(56) References Cited

U.S. PATENT DOCUMENTS 5,875,265 A  *  2/1999  Kasao ........................... 382/229
8,285,056 B2    10/2012  Taguchi et al.
(Continued)

FOREIGN PATENT DOCUMENTS

JP       01-102685  A       4/1989
JP       08-320929  A      12/1996
JP     2009-223414  A      10/2009

OTHER PUBLICATIONS

Taguchi et al., "Directional Adaptive Image Filter Respectively Adjusted to Edge and Flat Regions", The institute of Electronics, Information and Communication Engineers (IEICE), D, vol. J80-D2, No. 9, pp. 2345 to 2350.
Kouichi Sakai, "Basic and Application of Digital Image Processing based on Visual C#. NET & Visual Basic. NET—from basic concept to face image recognition-", CQ Publishing Co., Ltd., First edition published on Sep. 1, 2003, Chapter 5, Section 3, pp. 84 to 86.

*Primary Examiner* — Jingge Wu
(74) *Attorney, Agent, or Firm* — Volpe and Koenig, P.C.

(57) ABSTRACT

The present invention is a template matching processing device capable of evaluating a similarity degree which supports even a case of intensive morphological change between a design image and a photographic image. In the template matching processing device, matching processing between the design image and the photographic image is performed, a partial design image is obtained by clipping a portion having the highest correlation (step 101), and processing for deforming the photographic image in accordance with the clipped design image (steps 102 to 105) is performed, so that correlation between the deformed image obtained and the design image is taken to be set as the similarity degree.

5 Claims, 24 Drawing Sheets

(51) Int. Cl.
  *G01B 11/00* (2006.01)
  *G01B 15/00* (2006.01)
  *G06T 7/00* (2006.01)
  *H01L 21/66* (2006.01)

(52) U.S. Cl.
  CPC ............... *G06T 7/0044* (2013.01); *G06T 7/001* (2013.01); *G06T 2207/30148* (2013.01); *H01L 22/12* (2013.01)

USPC .......................................................... 382/170

(56) References Cited

U.S. PATENT DOCUMENTS

| | | | |
|---|---|---|---|
| 8,750,613 B2 * | 6/2014 | Lee ................................ | 382/168 |
| 2002/0165868 A1 * | 11/2002 | Kayahara .................... | 707/104.1 |
| 2003/0095197 A1 * | 5/2003 | Wheeler et al. ............... | 348/241 |

* cited by examiner

FIG. 7
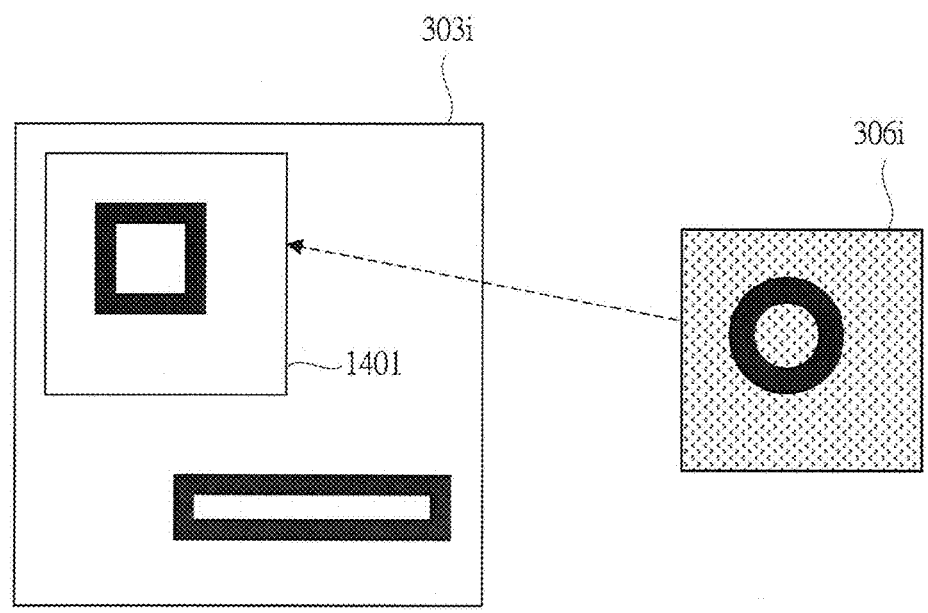
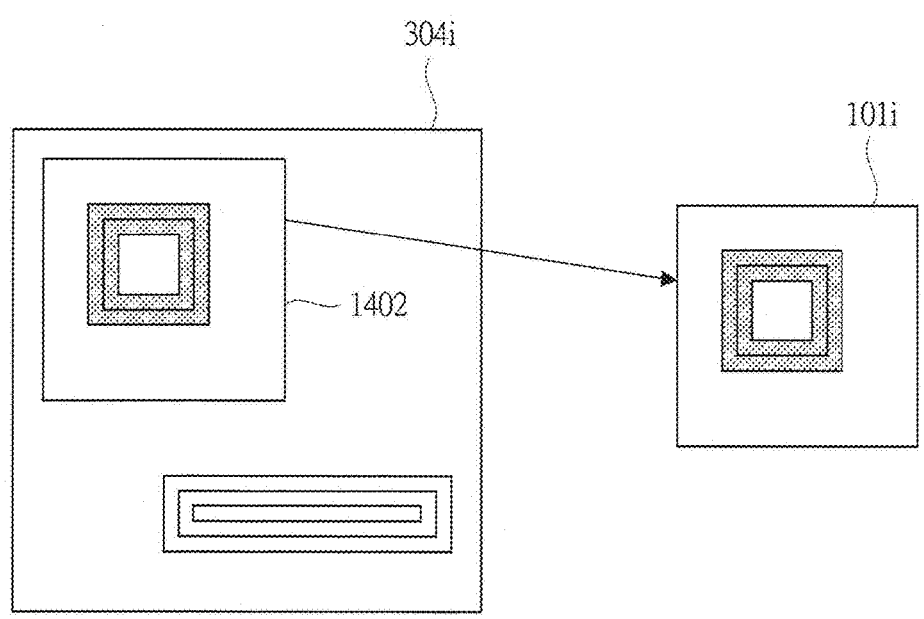

TEMPLATE MATCHING PROCESSING DEVICE AND TEMPLATE MATCHING PROCESSING PROGRAM

TECHNICAL FIELD

The present invention relates to a template matching processing device which performs template matching, and, more particularly, the present invention relates to a program which generates a judging function for judging whether or not an inspection object contains the same pattern as a template and a position detecting function for detecting a position of the same pattern and which is installed for use in various inspecting device, recognizing device, judging device, and others.

BACKGROUND ART

Japanese Patent Application Laid-Open Publication No. 2009-223414 (Patent Document 1) describes a method of matching a design image generated by CAD at a semiconductor design time with a photographic image obtained by taking a photograph of a semiconductor during its manufacturing by an electron microscope, and accurately reviewing a degree of the similarity again for a matched candidate position. In Patent Document 1, the review is performed by deforming the photographic image in accordance with the design image and evaluating the similarity degree for the deformed image.

As a specific processing procedure described in the embodiment of Patent Document 1, effective means for a type which is limited to some extent as a type of the photographic image are described.

PRIOR ART DOCUMENTS

Patent Document

Patent Document 1: Japanese Patent Application Laid-Open Publication No. 2009-223414

Non-Patent Documents

Non-Patent Document 1: Jun'ichi TAGUCHI et al., "Directional Adaptive Image Filter Respectively Adjusted to Edge and Flat Regions", The institute of Electronics, Information and Communication Engineers (IEICE), D, Vol. J80-D2, No. 9, pp. 2345 to 2350

Non-Patent Document 2: Kouichi SAKAI, "Basic and Application of Digital Image Processing based on Visual C#. NET & Visual Basic. NET—from basic concept to face image recognition—", CQ Publishing Co., LTd., First edition published on Sep. 1, 2003, Chapter 5, Section 3, pp. 84 to 86

DISCLOSURE OF THE INVENTION

Problems to be Solved by the Invention

However, in the processing of the photographic image performed in the embodiment of Patent Document 1, while a processing of luminance conversion whose upper-limit and lower-limit values are defined performed after edge enhancement is described, this processing is effective for a case that a contrast of a morphology portion in the photographic image is relatively good. When the contrast is poor, the upper limit and the lower limit cannot be appropriately defined, and therefore, performance degrades due to the usage of this method.

Further, in the deformation processing of the photographic image performed in the embodiment of Patent Document 1, a case that a degree of the deformation is relatively large is assumed, and a complicated processing is performed. However, in spite of the fact that a simple deformation processing is sufficient for a case that a photographic magnification is low and the degree of the deformation is small, the simple deformation processing is not described therein.

Accordingly, in various image types which have not been assumed in the embodiment of Patent Document 1, a preferred aim of the present invention is to provide a template matching processing device which can provide various means for improving performance for evaluating a similarity degree between a design image and a photographic image.

For example, as described above, the present invention provides a method of obtaining a relatively-good similarity degree even in a case of an image with poor contrast, a method of a simple deformation processing for an image with a small degree of deformation, and others.

The above and other preferred aims and novel characteristics of the present invention will be apparent from the description of the present specification and the accompanying drawings.

Means for Solving the Problems

The typical one of the inventions disclosed in the present application will be briefly described as follows.

That is, the typical one is summarized to include: a matching unit for obtaining a positional correspondence relation between a design image for matching generated from a design data for manufacturing a desired product and a photographic image obtained by taking a photograph of the product manufactured based on the design data by using a predetermined photographic device; a size selecting unit for selecting a design image having a size which can take the closest correspondence relation with the photographic image at the matching position defined by the matching unit, which is selected from a plurality of design images having different sizes and being manufactured from the design data; and a deforming/similarity-degree evaluating unit for deforming the photographic image and evaluating a desired similarity degree by referring to a design image for similarity degree evaluation having the size selected by the size selecting unit among a plurality of design images for similarity degree evaluation having different sizes and being manufactured from the design data.

Effects of the Invention

The effects obtained by typical aspects of the present invention disclosed in the present application will be briefly described below.

That is, as the effects obtained by the typical aspects, for handling various image types, performance of measurement of a similarity degree to be obtained is improved in some cases, and evaluation is simplified in some cases, so that system burden can be reduced.

BRIEF DESCRIPTIONS OF THE DRAWINGS

FIG. 7 is a diagram illustrating one example of matching in a processing of the template matching processing device according to the first embodiment of the present invention, and a positional correspondence relation;

BEST MODE FOR CARRYING OUT THE INVENTION

Hereinafter, embodiments of the present invention will be described in detail with reference to the accompanying drawings. Note that the same components are denoted by the same reference symbols throughout all drawings for describing the embodiments, and the repetitive description thereof will be omitted.

A feature of the present invention lies in an image processing executed by a template matching processing device for performing template matching, and various aspects can be taken as an embodiment for this image processing.

For example, an aspect of preparation of a dedicated hardware for performing the image processing of the present invention can be taken as the embodiment, and an aspect of preparation of a software describing a process of the image processing of the present invention and execution of this software by a general-purpose computer can be also taken.

When the general-purpose computer is used, a storage medium in which the software is stored can be arbitrarily executed without specifying a computer to be used, and therefore, this is an important universal component for executing the entire present invention, and is such an embodiment of the present invention that the storage medium is installed in an arbitrary part. As the storage medium in which the software is stored, there are a CD, a DVD, a memory card, a HD, an external storage device whose connection and data download can be achieved via Internet, and others.

First Embodiment (1.1) Configuration

Figure 1:
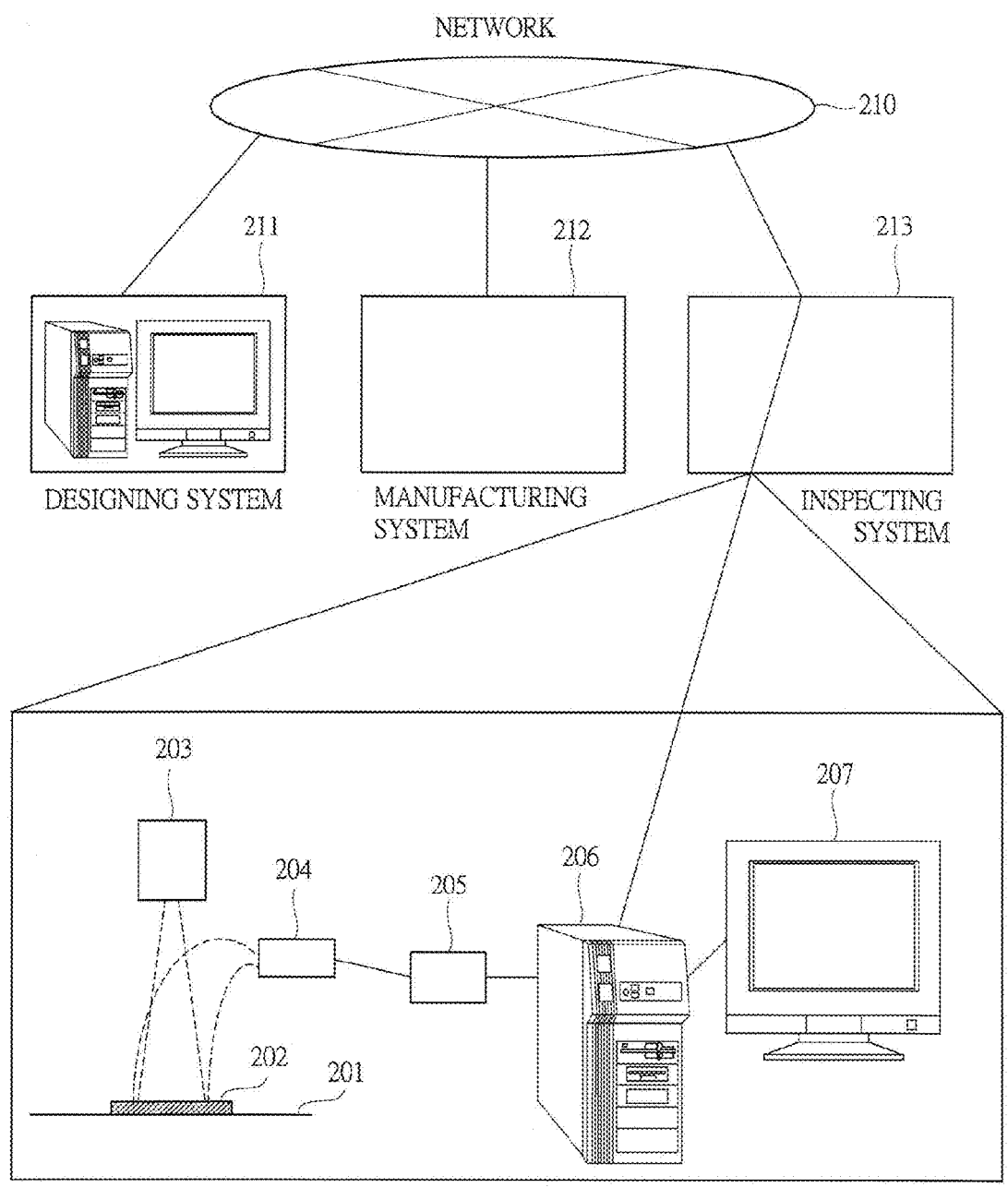
FIG. 1 is a diagram illustrating an entire configuration of a system including a template matching processing device according to a first embodiment of the present invention.
Figure 2:
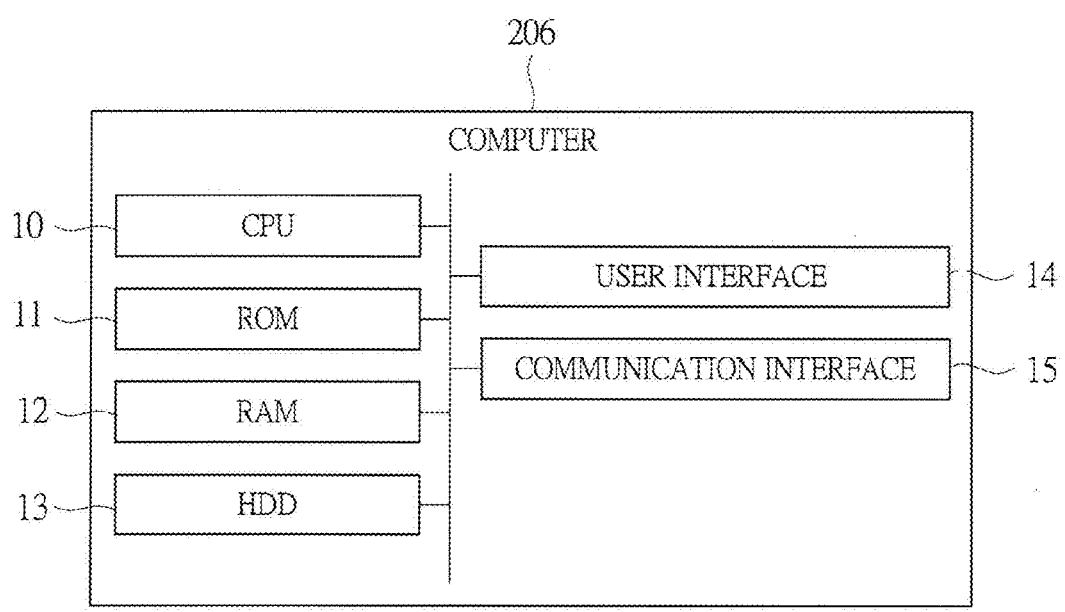
FIG. 2 is a diagram illustrating one example of a hardware configuration of the template matching processing device according to the first embodiment of the present invention.

With reference to FIGS. 1 and 2, an entire configuration of a system including a template matching processing device according to a first embodiment of the present invention will be explained. FIG. 1 is a diagram illustrating the entire configuration of the system including the template matching processing device according to the first embodiment of the present invention, and FIG. 2 is a diagram illustrating one example of a hardware configuration of the template matching processing device according to the first embodiment of the present invention.

In FIG. 1, the system including the template matching processing device is configured of: a designing system 211; a manufacturing system 212; and an inspecting system 213, which are connected to each other via a network 210.

The inspecting system 213 is provided with: a scanning electron microscope including a stage 201, an electron gun 203, a secondary electron detection unit 204, and an imaging unit 205; a computer 206 operated as the template matching processing device; a display device 207; and others such as various inspecting devices. Further, the computer 206 may be embedded inside the scanning electron microscope, or may be provided outside the same.

The first embodiment relates to a method of image processing in which the computer 206 operated as the template matching processing device performs the image processing, and, more particularly, has a feature in a method of evaluating a similarity degree by a template matching processing among image processing.

In the designing system 211, a semiconductor circuit is designed with using CAD, and various pieces of design data such as a mask data of a lithography apparatus utilized in manufacture are generated.

In the manufacturing system 212, the design data for each manufacturing apparatus generated in the designing system 211 is delivered to each apparatus via the network 210, and a semiconductor is manufactured based on the design data in each apparatus on an assembly line. In a lithography apparatus which is one of the manufacturing apparatuses, a mask worked based on the mask data generated in the designing system 211 is attached, a resist is exposed by photolithography, and then, the exposed portion is etched, so that a circuit pattern with the resist on a surface of the semiconductor can be formed.

To the inspecting system 213, the semiconductor which has been manufactured in the manufacturing system 212 or is still during the manufacture therein is conveyed so as to perform a predetermined inspection. If the semiconductor is still during the manufacture, when a result of the inspection is bad, the semiconductor is discarded or is conveyed so as to be delivered to a re-manufacturing process.

The semiconductor with the resist pattern thereon which has been made in the lithography step of the manufacturing system 212 but which is still during the manufacture is conveyed so as to be subjected to photographing and inspection by the scanning electron microscope in the inspecting system 213. In the scanning electron microscope, by the stage 201 included therein, the semiconductor 202 with the resist thereon of an inspection object is conveyed to a photographing view field, electrons are shot by the electron gun 203, emitted secondary electrons therefrom in scanning a predetermined region of the inspection object 202 are captured by the secondary electron detection unit 204, and an image data of the photographic image is obtained in the imaging unit 205.

In order to obtain the photographic image, the imaging unit 205 transmits a control signal for operating the stage 201, the electron gun 203, and the secondary electron detection unit 204, and signals which have been detected by the secondary electron detection unit 204 are properly and sequentially positioned so as to obtain the image data.

The computer 206 receives the image data of the photographic image generated in the imaging unit 205 and the design data designed in the designing system 211, performs a predetermined image processing, and displays a result of the processing on the display device 207.

In FIG. 2, the computer 206 operated as the template matching processing device is provided with hardwares such as a CPU 10, a ROM 11, a RAM 12, a HDD 13, a user interface 14, and a communication interface 15, which are similar to those of a normal computer device. In the computer 206, a template matching processing program or others stored in the HDD 13 or others is executed by the CPU 10, so that the template matching processing is performed.

(1.2) Entire Processing Procedure

Figure 3:
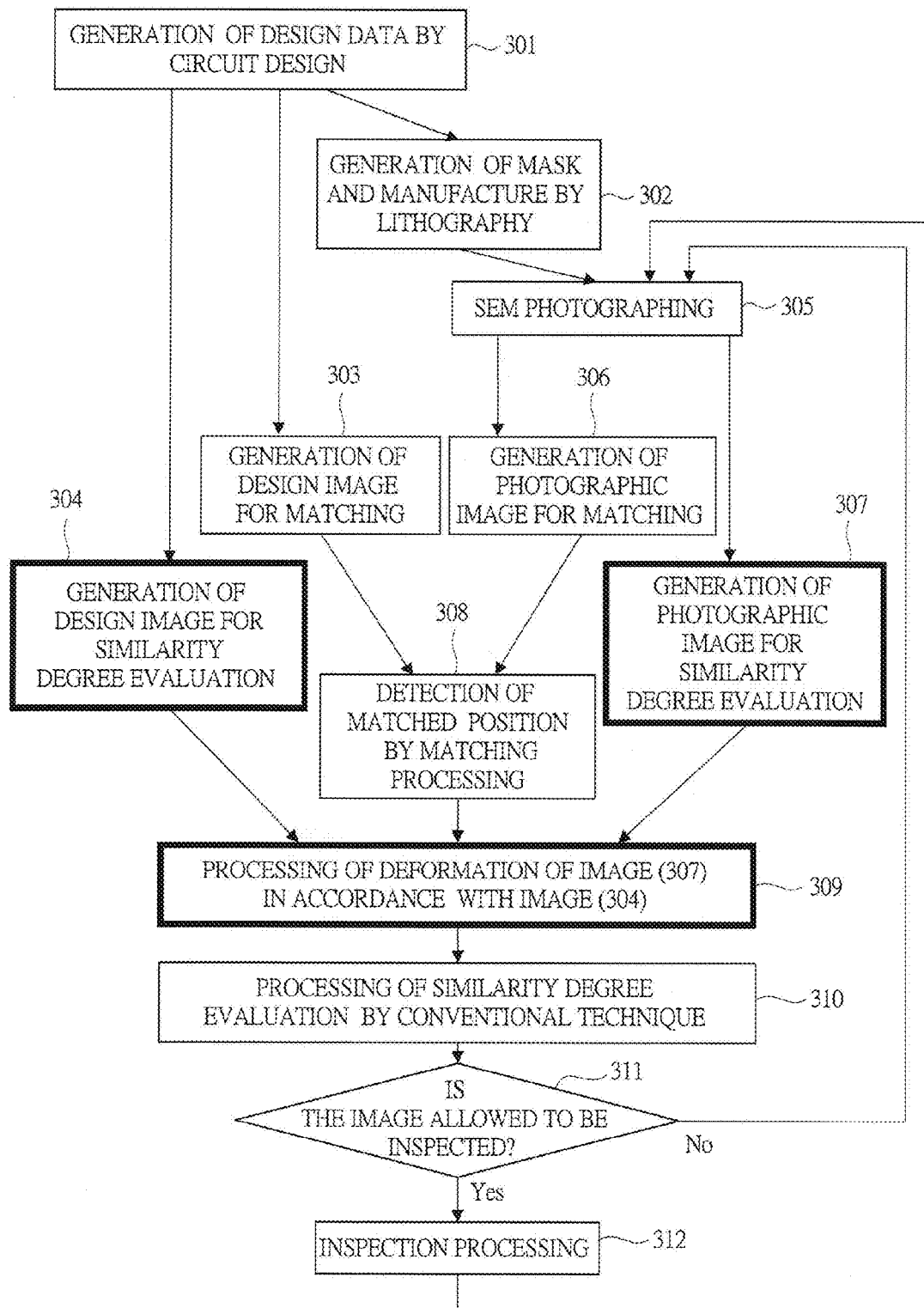
FIG. 3 is a flowchart illustrating a processing procedure of the system including the template matching processing device according to the first embodiment of the present invention.
Figure 4:
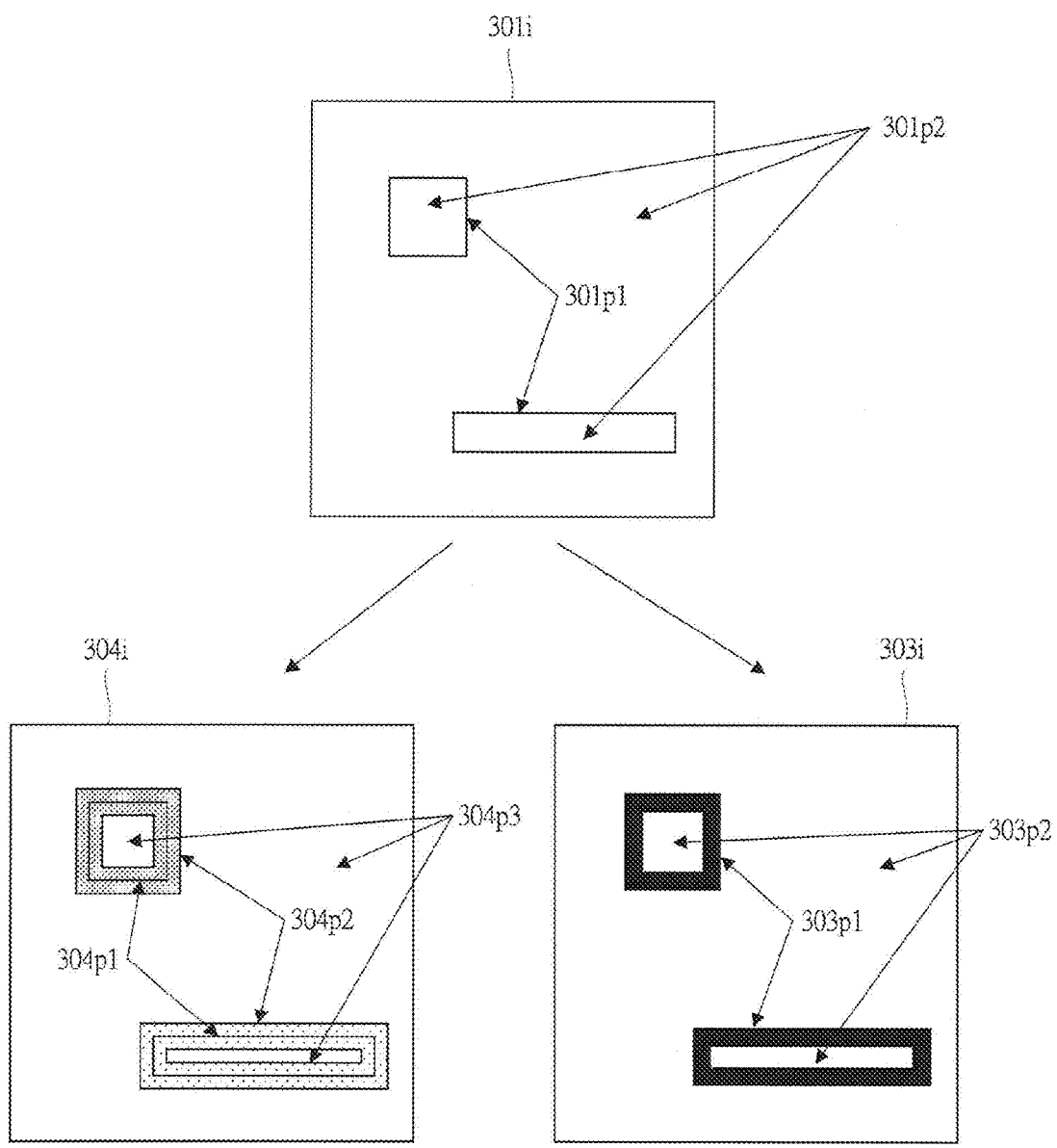
FIG. 4 is a schematic diagram illustrating one example of a design image used in the system including the template matching processing device according to the first embodiment of the present invention.
Figure 5:
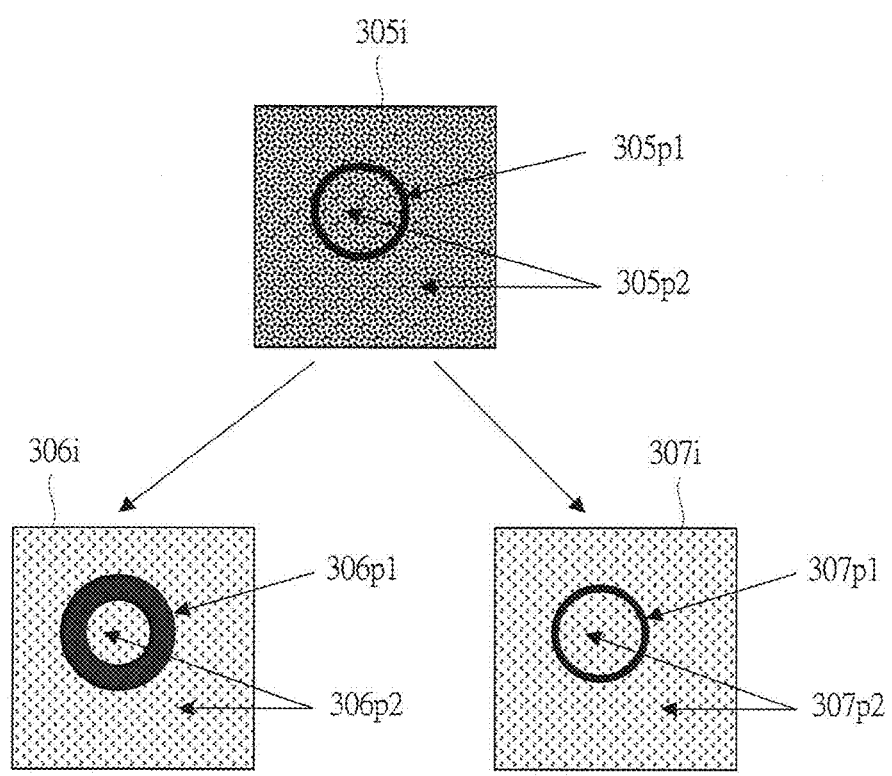
FIG. 5 is a schematic diagram illustrating one example of a photographic image used in the system including the template matching processing device according to the first embodiment of the present invention.

With reference to FIGS. 3 to 5, a processing procedure of the system including the template matching processing device according to the first embodiment of the present invention will be explained. FIG. 3 is a flowchart illustrating the processing procedure of the system of the template matching processing device according to the first embodiment of the present invention, and explains the procedure with using numbers in FIG. 3 as step numbers. FIG. 4 is a schematic diagram illustrating one example of a design image used in the system including the template matching processing device according to the first embodiment of the present invention, FIG. 5 is a schematic diagram illustrating one example of a photographic image used in the system including the template matching processing device according to the first embodiment of the present invention, and each image is denoted by and referred to as an image number illustrated in the schematic diagrams in FIGS. 4 and 5.

Step 301:

In the designing system 211, a semiconductor circuit is designed with using CAD, so that various types of the design data are generated. The various types of the design data include a mask data which designs a mask utilized in the lithograph apparatus included in the producing system 212.

Step 302:

In the manufacturing system 212, the mask is manufactured based on the mask data generated at the step 301, the mask is attached to the lithography apparatus, a resist is exposed by photolithography, and then, the exposed portion is etched, so that a circuit pattern with the resist on a surface of the semiconductor is formed.

Step 303: (See FIG. 4)

In the designing system 211, a design image 301$i$ on which the circuit pattern is drawn is generated from the design data generated at the step 301, and is subjected to a processing for thickening lines, so that a design image for matching 303$i$ is generated. The processing for thickening lines is achieved by performing Max3 process a predetermined number of times, the Max3 process selecting the maximum value from total nine pixels including an interesting pixel and vertical, horizontal, and oblique pixels adjacent thereto.

FIG. 4 illustrates a schematic diagram of one example of the design image 301$i$ and the design image for matching 303$i$. The design image 301$i$ is an image formed of: a morphology portion 301$p$1 constituted by a contour for forming morphology; and a background portion 301$p$2 which is the rest. A value of the morphology portion 301$p$1 is defined as 1, and a value of the background portion 301$p$2 is defined as 0. By the Max3 process, the morphology portion 301$p$1 is expanded to form a matching morphology portion 303$p$1, and the background portion 301$p$2 is narrowed to form a matching background portion 303$p$2.

Step 304: (See FIG. 4)

In the designing system 211, a design image for similarity degree evaluation 304$i$ for indicating a location whose similarity degree is to be evaluated is generated based on the design image 301$i$ generated during the processing at the step 303. One example of the design image for similarity degree evaluation 304$i$ is illustrated in FIG. 4. In this example, the design image for similarity degree evaluation 304$i$ is formed of: a morphology evaluation portion 304$p$1 corresponding to the morphology portion 301$p$1 of the design image 301$i$; a vicinity-of-morphology non-evaluation portion 304$p$2 in vicinity of the morphology evaluation portion 304$i$ within a predetermined distance therefrom; and an out-of-morphology evaluation portion 304$p$3 which is other region used for evaluation. A value of the morphology evaluation portion 304$p$1 is defined as 1, a value of the vicinity-of-morphology non-evaluation portion 304$p$2 is defined as 0, and a value of the out-of-morphology evaluation portion 304$p$3 is defined as −1.

Step 305: (See FIG. 5)

In the inspecting system 213, a photograph of the semiconductor with the resist thereon which has been manufactured at the step 302 is taken by the scanning electron microscope to obtain a photographic image 305i. One example of the photographic image 305i is illustrated in FIG. 5. The photographic image 305i is formed of: a white band portion 305p1 which is viewed more intensely than other locations if there is an edge portion on the semiconductor with the resist thereon due to working or others; and a background portion 305p2 which is the rest.

Here, it is assumed that the photographic magnification is twenty-thousand magnification or others which is a relatively low magnification for the electron microscope, and therefore, the photographic image 305i slightly contains a portion which is not clearly viewed due to a narrow width of the white band portion 305p1.

Step 306: (See FIG. 5)

In the computer 206, a photographic image processed for matching 306i is generated from the photographic image 305i whose photograph has been taken at the step 305. One example of the photographic image processed for matching 306i is illustrated in FIG. 5. The matching processing is a processing for thickening the white band by applying an edge-preserving image filter for removing noises so that morphology such as the white band remains thereto with and performing the Max3 process a predetermined number of times thereto. As the edge-preserving image filter, for example, such a directionally-dependent filter as cited in Non-Patent Document 1 can be adopted.

This directionally-dependent filter is of a non-linear filter type focusing on a direction of an edge, and for performing a non-linear smoothing processing of an image.

Note that the "Max3 processing" is a processing of selecting the maximum value among the pixel values of 9 pixels including the nearest-vicinity 8 pixels vertically, horizontally, and obliquely to the interesting image pixel and the interesting pixel itself to set the maximum value as a new pixel value of an interesting point.

According to these processing, the photographic image processed for matching 306i has a better contrast between the white band portion 306p1 and the background portion 306p2 than that of the photographic image 305i, and therefore, has a thick white band portion 306p1.

Step 307: (See FIG. 5)

In the computer 206, a photographic image processed for similarity degree evaluation 307i is generated from the photographic image 305i whose photograph has been taken at the step 305. One example of the photographic image processed for similarity degree evaluation 307i is illustrated in FIG. 5. In the processing for similarity degree evaluation, it is preferred to use a filter for removing noises so that the morphology such as the white band portion remains, and, for example, the edge-preserving image filter described in Non-Patent Document 1 and used at the step 306 can be used. In this case, unnecessary double work is avoided by performing the step 307 first, and then, performing the Max3 process a predetermined number of times at the step 306 with using a result of the step 307.

The photographic image processed for similarity degree evaluation 307i has a better contrast between the white band portion 307p1 and the background portion 307p2 which is the rest than that of the photographic image 305i.

Step 308: [Matching Unit] (See FIG. 5)

In the computer 206, template matching is performed between the design image for matching 303i generated at the step 303 and the photographic image processed for matching 306i generated at the step 306.

The template matching is a general method, and is described in, for example, Non-Patent Document 2.

The processing of the template matching is to previously define a template smaller than an image and compare the template with an input image.

Here, as assuming a case that an image size of the design image for matching 303i is prepared to be larger than that of the photographic image processed for matching 306i, the template matching is performed with using the photographic image processed for matching 306i as the template and the design image for matching 303i as the input image.

In the template matching, as described in Non-Patent Document 2, with taking such a basic unit as evaluation of the similarity degree between the template and the input image obtained when both of them are overlapped with each other as an evaluation value, a processing for obtaining the evaluation values in cases of all the overlapping that the template is gradually shifted so as to cover all part of the input image is performed. While there are various methods as a method of evaluating the evaluation values, the method here is a processing of evaluating correlation obtained when the template and the input image are overlapped with each other.

According to the above-described processing, a location having the highest evaluation value is defined as the most matched location in a predetermined evaluation computing method for the photographic image processed for matching 306i and the design image for matching 303i.

However, by changing the evaluation method to the other method, the other location becomes the most matched location in the other evaluation computing method in some cases. Generally, it is not ensured that the location having the highest evaluation value is a practically-matched location. Further, there are such a case that the photographic image is a photographic image which has been taken at the other location and even such a case that there is no matched location between both of them.

Step 309: (See FIGS. 4, 5, and 8)

In the computer 206, at the overlapping position where the evaluation value is the highest in the matching processing at the step 308, the photographic image for similarity degree evaluation 307i generated at the step 307 is deformed with referring to the design image for similarity degree evaluation 304i generated at the step 304.

A specific processing method will be described later in Section (1.3) with reference to FIGS. 7 and 8. By this processing, a photographic image 309i obtained by deforming the photographic image for similarity degree evaluation is generated.

Step 310: [Similarity-Degree Evaluating Unit] (See FIG. 4)

In the computer 206, the similarity degree is evaluated with referring to the deformed photographic image for similarity degree evaluation 309i generated at the step 309 and the design image for similarity degree evaluation 304i at the position where the evaluation value is the maximum at the step 308. In the evaluation of the similarity degree, the correlation between both of the morphology evaluation portion 304p1 and the out-of-morphology evaluation portion 304p3 is evaluated without including the evaluation computing for the vicinity-of-morphology non-evaluation portions 304p2. The correlation computing is expressed by the following (Formula 1) to (Formula 5).

$$v = \Sigma(A(i,j) - Ah) \times (B(i,j) - Bh)/(Aa \times Ba) \quad \text{(Formula 1)}$$

$$Ah = \Sigma A(i,j)/N \quad \text{(Formula 2)}$$

$$Bh = \Sigma B(i,J)/N \quad \text{(Formula 3)}$$

$$Aa = \text{sqrt}(\Sigma(A(i,j)-Ah) \times (A(i,j)-Ah)/N) \quad \text{(Formula 4)}$$

$$Ba = \text{sqrt}(\Sigma(B(i,j)-Bh) \times (B(i,j)-Bh)/N) \quad \text{(Formula 5)}$$

Note that it is assume that a term "A (i, j)" means a value at a point (i, j) on an image obtained by clipping the design image for similarity degree evaluation 304i at the position where the evaluation value is the maximum at the step 308 by a length of the photographic image 305i, a term "B (i, j)" means a value at the point (i, j) on the deformed photographic image for similarity degree evaluation 309i, a symbol "Σ" means addition at the point (i, j) in which a range of the addition is a whole set of such points as belonging to either one of the positions of the morphology evaluation portion 304p1 and the out-of-morphology evaluation portion 304p3.

A symbol "N" means a total number of points regarded in the range of Σ, and a term "sqrt ( )" means taking square root, and a symbol "v" means the correlation value to be obtained and is set as the similarity degree.

Step 311:

In the computer 206, if the similarity degree obtained at the step 310 is equal to or larger than a predetermined value, the matching position is regarded as a right position, and therefore, the process proceeds to an inspection processing at a step 312. If not, the matching position is not the right position, and therefore, this semiconductor is regarded as not suitable for the inspection, and the process proceeds to a step 305 so as to take a photograph of a next semiconductor.

Step 312:

In the computer 206, a predetermined inspection processing of the semiconductor is performed. As the inspection, there are various types such as measurement of a line width at a desired location, and a photograph of a required site is taken in some cases so as to perform an inspection processing required for quality control of manufacturing steps of the semiconductor.

(1.3) Detailed Procedure of Feature Portion

Figure 6:
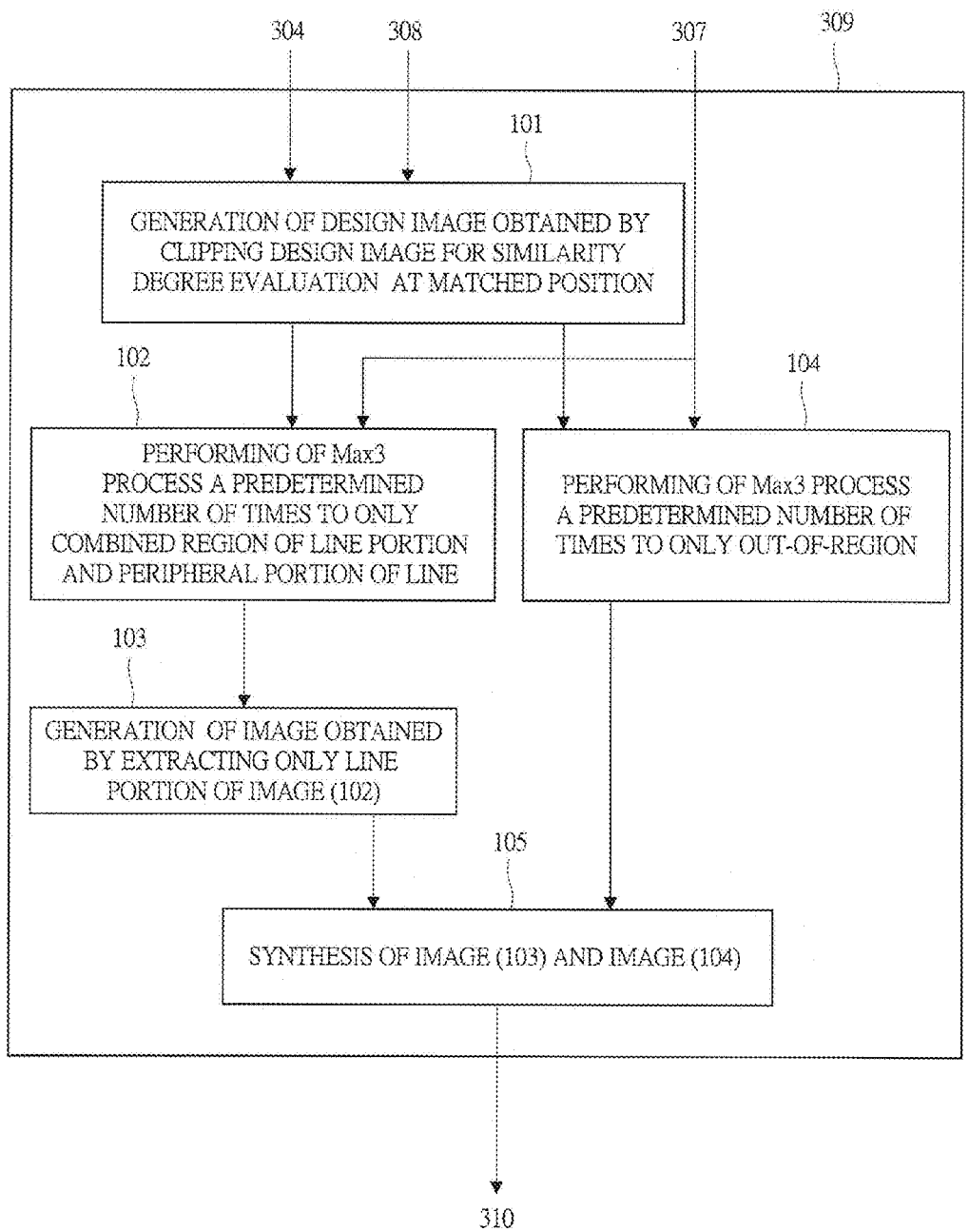
FIG. 6 is a flowchart illustrating a detailed procedure of a feature portion of the template matching processing device according to the first embodiment of the present invention.
Figure 8:
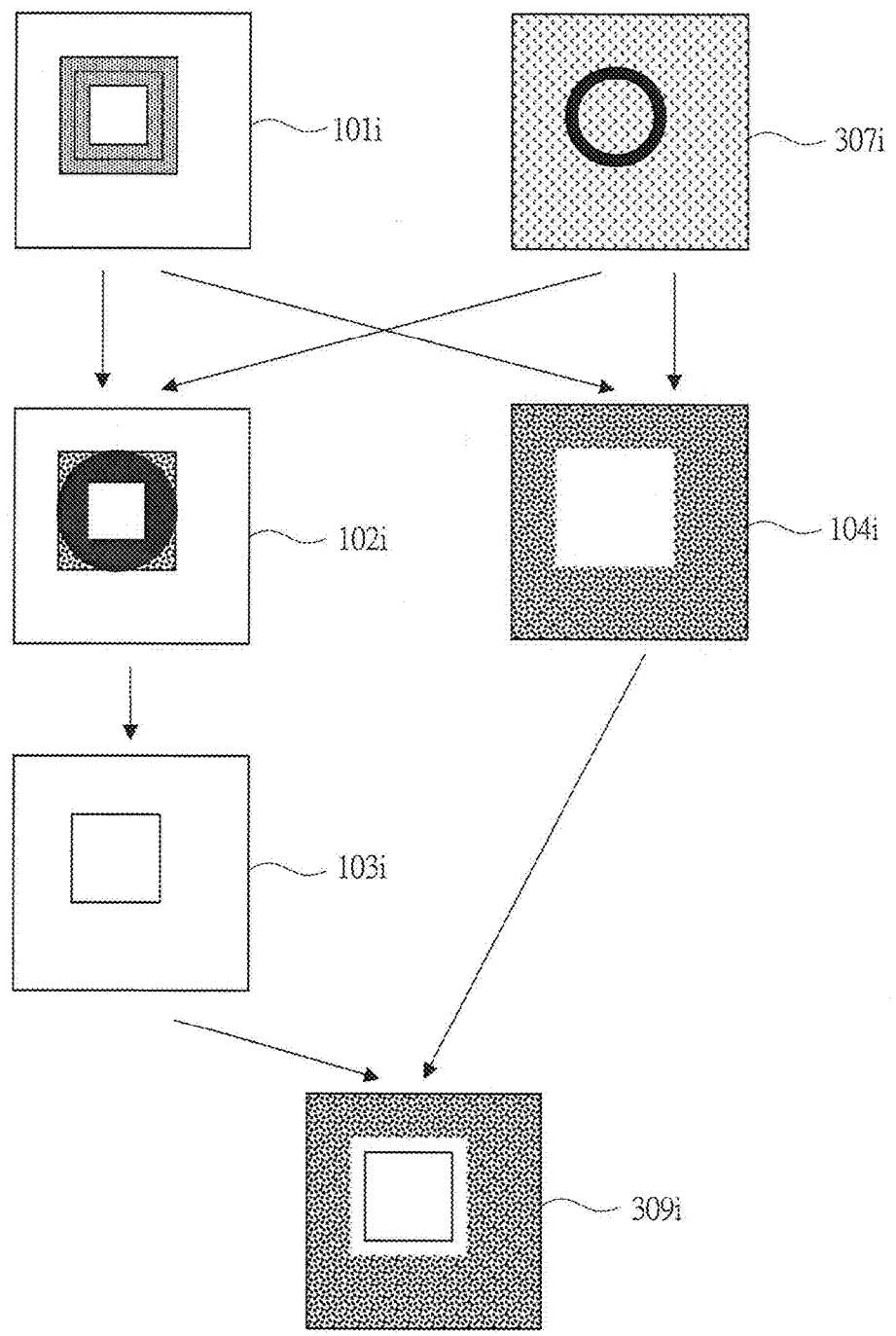
FIG. 8 is a diagram illustrating a deformation example of a photographic image obtained by referring to a design image in processing of the template matching processing device according to the first embodiment of the present invention.

With reference to FIGS. 6 to 8, a detailed procedure of the feature portion of the template matching processing device according to the first embodiment of the present invention will be explained. FIG. 6 is a flowchart illustrating the detailed procedure of the feature portion of the template matching processing device according to the first embodiment of the present invention, and illustrates details of the processing at the step 309 in FIG. 3. FIG. 7 is a diagram illustrating one example of matching and a positional correspondence relation in the processing of the template matching processing device according to the first embodiment of the present invention, and FIG. 8 is a diagram illustrating a deformation example of a photographic image obtained with referring to the design image in the processing of the template matching processing device according to the first embodiment of the present invention.

Step 101: (See FIG. 7)

As a result of the matching processing at the step 308 in FIG. 3, an image of the design image for similarity degree evaluation 304i is clipped at the same position 1402 as the position 1401 where the evaluation value has been the highest so as to generate a deformation-processing clipped design image 101i.

Step 102: (See FIG. 8)

On an image obtained by copying values of only a site corresponding to a combined region of addition of the morphology evaluation portion 304p1 and the vicinity-of-morphology non-evaluation portion 304p2 on the photographic image processed for similarity degree evaluation 307i, the Max3 process is performed a predetermined number of times to only an inside of the combined region so as to generate a processed image 102i.

Step 103 (See FIG. 8)

An image 103i obtained by copying values of only the morphology evaluation portion 304p1 on the processed image 102i the step 102 is generated. The value of other portion is set to 0.

Step 104: (See FIG. 8)

On an image obtained by copying values of only a site corresponding to the out-of-morphology evaluation portion 304p3 and filling the value of 0 in other portion on the photographic image processed for similarity degree evaluation 307i, the Max3 process is performed a predetermined number of times to only a region corresponding to the out-of-morphology evaluation portion 304p3 so as to generate a processed image 104i. The number of times of the Max3 process is equal to the number of times of the Max3 process performed at the step 102.

Step 105: (See FIG. 8)

The processed image 102i which has been generated in the processing at the 102 and the processed image 104i which has been generated in the processing at the step 104 are added together so as to generate a synthesized image. The synthesized image generated is to be a photographic image deformed for similarity degree evaluation 309i.

By the above-described processing, the photographic image processed for similarity degree evaluation 309i is obtained, and the similarity degree is evaluated at a next step 310.

(1.4) Comparison with Conventional Technique

The conventional technique also has the configuration illustrated in FIG. 1 as the same as that of the first embodiment. The first embodiment and the conventional technique are different from each other in how to processing by the computer 206.

Figure 9:
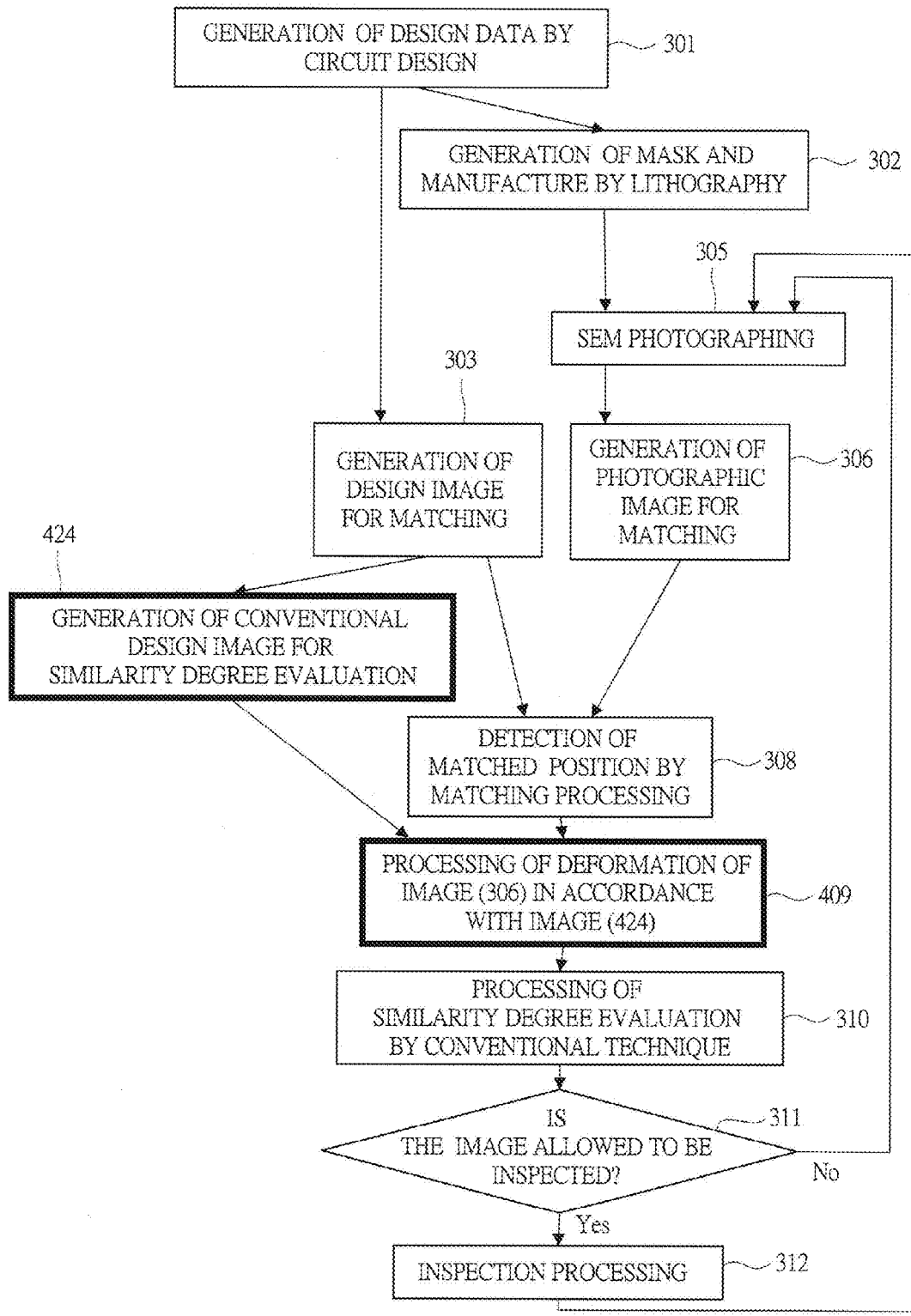
FIG. 9 is a flowchart illustrating an entire processing procedure of a conventional technique.
Figure 10:
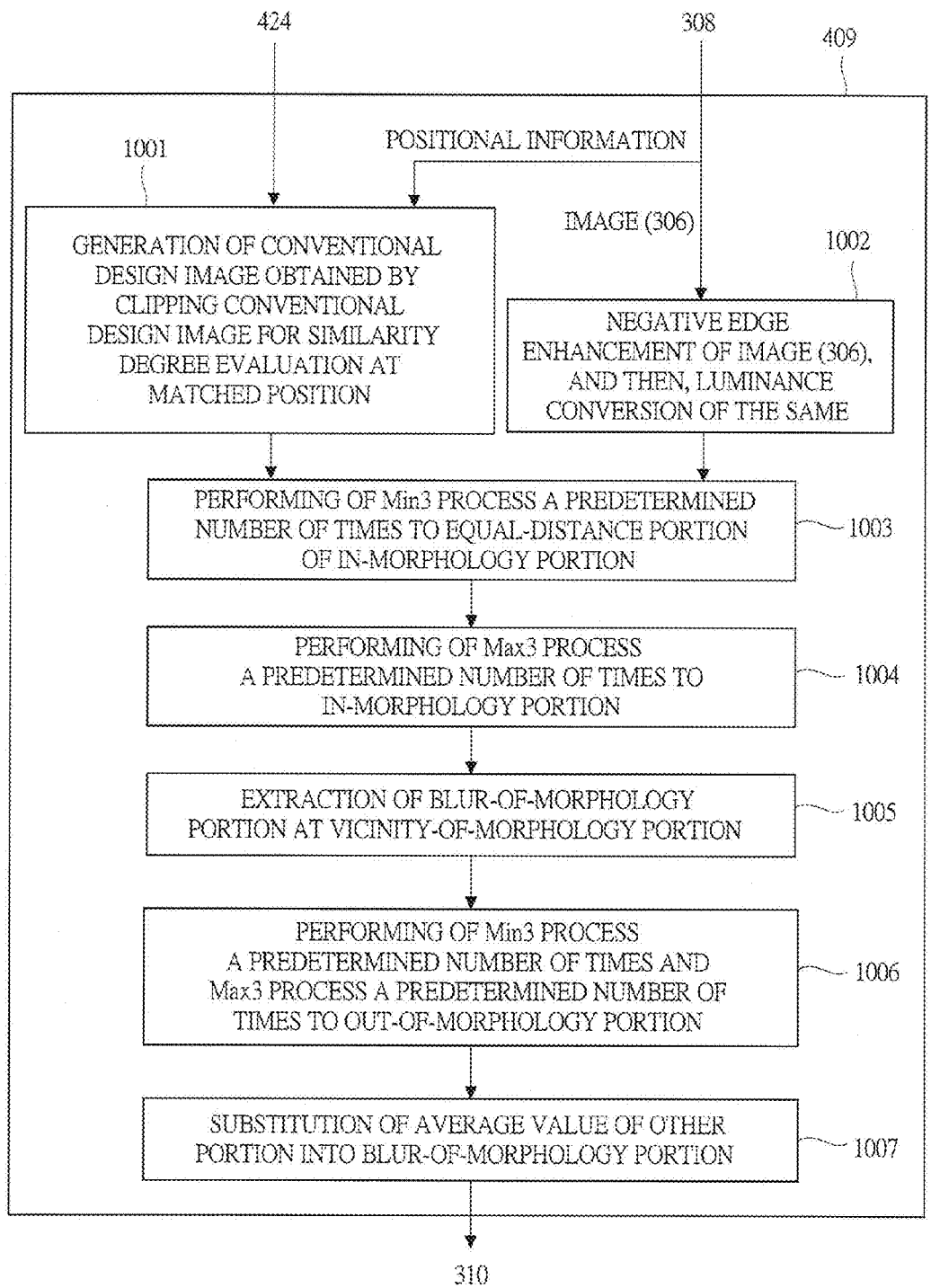
FIG. 10 is a flowchart illustrating a processing procedure of a feature portion of the conventional technique.

With reference to FIGS. 9 and 10, a processing procedure of the conventional technique as a comparative example of the template matching processing device according to the first embodiment of the present invention will be explained. FIG. 9 is a flowchart illustrating the entire processing procedure of the conventional technique. The procedure of the first embodiment illustrated in FIG. 3 and the processing procedure of the conventional technique illustrated in FIG. 9 are compared with each other, and positions of a different procedure between both of them are illustrated with a thick frame in FIGS. 3 and 9. Hereinafter, only different parts between both of them will be described. FIG. 10 is a flowchart illustrating a processing procedure for the feature portion in the conventional technique.

As illustrated in FIG. 9, in the conventional technique, a conventional design image for similarity degree evaluation is generated at a step 424 with referring to the design image for matching 303i generated at the step 303.

As illustrated in FIG. 3, in the first embodiment, the image for similarity degree evaluation 304i is generated at the step 304 with referring to the design data generated at the step 301. Also, while the photographic image processed for similarity degree evaluation 307i is generated at the step 307 in the first embodiment, the photographic image processed for matching 306i is also used for the similarity degree evaluation in the conventional technique. And, in the processing of deforming the photographic image, the first embodiment and the conventional technique are different from each other as performed at the step 309 and the step 409, respectively.

The design image for similarity degree evaluation in the conventional technique has a thick morphology portion and takes a distance from an edge as a value. Further, a vicinity-of-morphology portion takes a distance from the edge as a negative value. An outside evaluation portion takes 0 as a value.

FIG. 10 is a processing procedure of the deformation processing 409 for the photographic image in the conventional technique.

At a step 1001, a conventional design image at the position where the evaluation has been the highest in the matching is clipped by a length of the photographic image 305i. At a step 1002, negative edge enhancement is performed to the photographic image for matching processing 306, and then, luminance conversion is performed thereto, and a photographic processed image for evaluating the similarity degree is obtained here.

At a step 1003, the Min3 Process is performed a predetermined number of times to a region of the photographic processed image corresponding to only an equal-distance portion of the morphology portion, and then, the Max3 process is performed a predetermined number of times thereto at a step 1004.

At a step 1005, in a region of the photographic processed image corresponding to the vicinity-of-morphology portion, a region-growing method is performed to a site whose value is lower than a predetermined value with taking a site adjacent to the morphology portion as a base point, so that a blur-of-morphology portion is extracted. At a step 1006, to a region of the photographic processed image corresponding to the out-of-morphology portion, the Min3 process is performed a predetermined number of times, and then, the Max3 process is performed thereto a predetermined number of times.

Finally, at a step 1007, in order to set the blur-of-morphology portion as a non-evaluation portion, a value of the photographic processed image corresponding to the blur-of-morphology portion obtained at the step 1005 is replaced by an average value of values of the other processed images so that a deformed image is obtained.

Note that, for the design image for evaluating the similarity degree, with setting a value of the in-morphology portion as "1", a value of the non-evaluation portion as "0", and a value of the design image which is not the in-morphology portion and not the non-evaluation portion as "−1", the correlation between the deformed image and the design image is taken at the step 309 so as to evaluate the similarity degree.

Here, the Min3 process is a processing of selecting the minimum value from pixel values in 9 pixels including the nearest-vicinity 8 pixels vertically, horizontally, and obliquely adjacent to an interesting image pixel and the interesting image pixel itself and setting the selected value as a new pixel value of an interesting point.

As described above, the first embodiment and the conventional technique are largely different from each other in how to deform the image. A reason why they are different from each other in the processing as described above is that they are different from each other in an image type effective by how to perform such a processing.

In the processing of the conventional technique, the magnification of the photographic image is relatively high, so that the white band is thickly viewed, and the morphological change between the design image and the photographic image is large, and therefore, a case of an image requiring larger deformation than that of the first embodiment is assumed. In such an image, the Max3 process is performed many times to both of the photographic image and the design image so as to generate an image obtained by boldly thickening the white band of the photographic image, and besides, boldly thickening the line of the morphology portion of the design image.

Accordingly, in images of both of them in a selected site having a high similarity degree in the matching, the white band and the morphology portion overlap with each other so as to connect to each other thinly long. For such an image, the processing of the conventional technique is a processing of approximating the photographic image to the design image with referring to the design image.

In the first embodiment, the photographic magnification is twenty-thousand magnification or others which is a relatively low magnification for the electron microscope, and therefore, the photographic image slightly contains the portion which is not clearly viewed due to the narrow width of the white band portion of the photographic image. In such an image, a degree of the change between the design image and the photographic image is smaller than that in the conventional technique, and such a relatively simple deformation processing as that in the first embodiment is sufficient.

As described above, the first embodiment has the feature of the simple deformation for the photographic image in accordance with the small degree of the deformation change between the photographic image and the design image due to the low photographing magnification. Therefore, it has such an advantage that the processing is simple and stable performance can be obtained.

(1.5) Others

Figure 11:
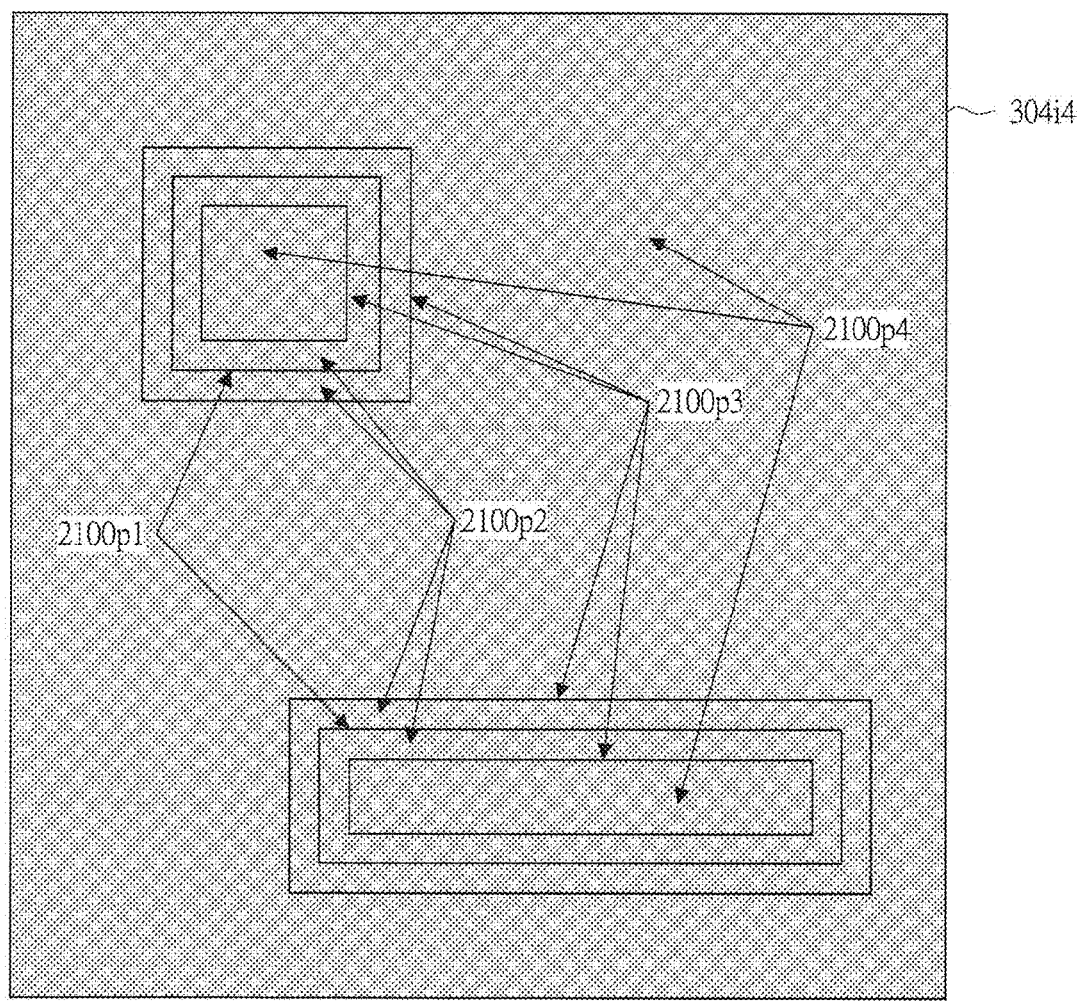
FIG. 11 is a diagram illustrating an example of generating a design image for similarity degree evaluation of the template matching processing device according to the first embodiment of the present invention.
Figure 12:
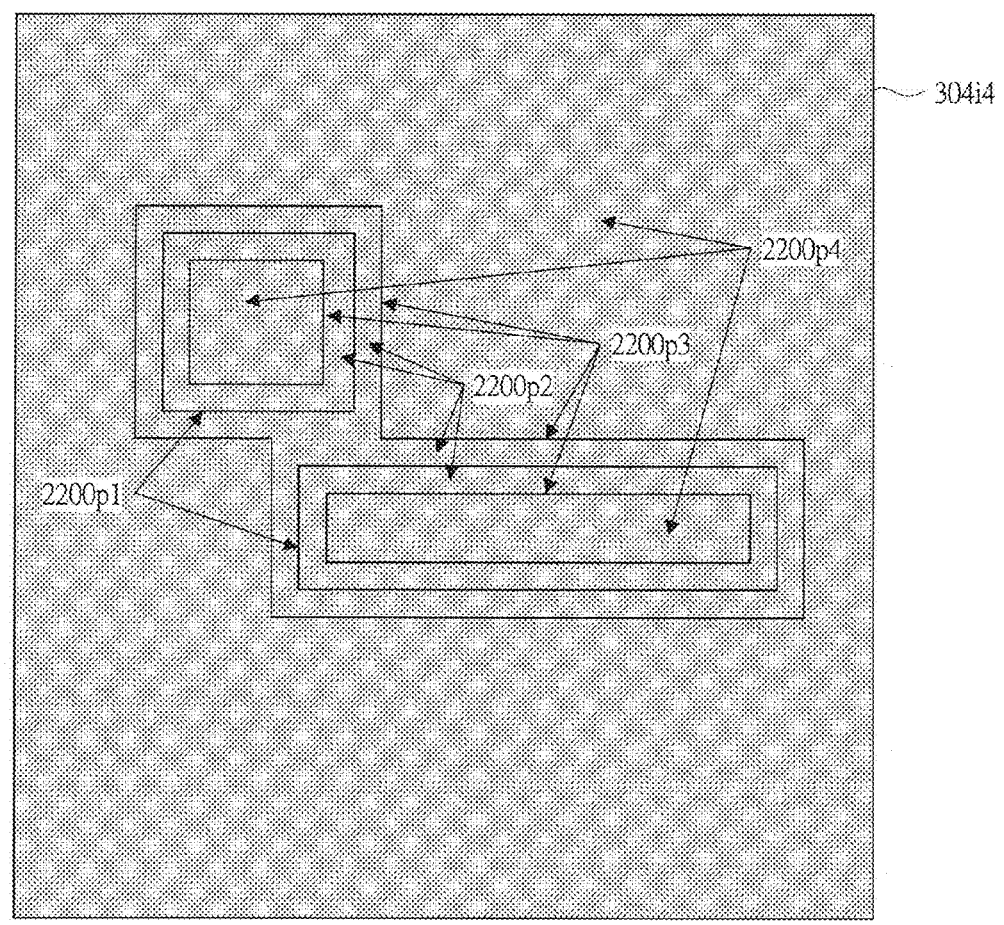
FIG. 12 is a diagram illustrating an example of generating the design image for similarity degree evaluation of the template matching processing device according to the first embodiment of the present invention.

Other aspects in which a method of the processing in each step of the first embodiment has been changed will be briefly explained. FIGS. 11 and 12 are diagrams illustrating a generation example of the design image for similarity degree evaluation of the template matching processing device according to the first embodiment of the present invention.

An image obtained by performing an edge detection processing to the processed result image described at the step 307 in FIG. 3 can be used as the image processed for similarity degree evaluation 307i. As the edge detection processing, there are various methods such as a processing of selecting the maximum value from absolute values of respective differences between an interesting pixel itself and the nearest-vicinity 8 pixels vertically, horizontally, and obliquely adjacent to the interesting pixel so that the maximum value is used as a value of the edge.

In addition, there are other types of the processing of detecting the edge such that a difference between the value of the interesting pixel itself and an average value of the nearest-vicinity 8 pixels is used or an absolute value of the difference is used as the value of the edge. In a case that the width of the white band of the photographic image is narrow such as about 1 to 2 pixels, such an edge detection processing has an effect of being able to stably evaluate the similarity degree even if density unevenness occurs in the image.

Even at the step 304 in FIG. 3, the value of the morphology portion is set as "1" by performing the edge detection for the design image 301i first and performing a predetermined threshold operation, and then, the processing for generating the vicinity-of-morphology non-evaluation portion and the out-of-morphology evaluation portion can be performed as similarly to the processing described at the step 304. In this case, the morphology portion is thickened. Therefore, when the edge detection processing is performed at the step 307 as described above, thicknesses of lines of both of them are well-balanced, so that it has the effect of being able to stably evaluate the similarity degree.

Note that a similar effect to expansion of the width of the morphology portion can be obtained here even if the Max3 process is performed to the design image.

As illustrated in FIGS. 11 and 12, also on the design image for similarity degree evaluation generated at the step 304 in FIG. 3, the thickness of the out-of-morphology evaluation portion is decreased, so that the other portion can be the out-of-morphology non-evaluation portion.

When the out-of-morphology non-evaluation portion is provided, in the evaluation of the similarity degree at the step 311 in FIG. 3, a region of the out-of-morphology non-evaluation portion together with the vicinity-of-morphology non-evaluation portion is not taken for the evaluation computing of the similarity degree.

FIG. 11 illustrates four divided regions of a morphology evaluation portion 2100p1, a vicinity-of-morphology non-evaluation portion 2100p2, an out-of-morphology evaluation portion 2100p3, and an out-of-morphology non-evaluation portion 2100p4. For example, the number of times of the Max3 process performed in the deformation processing at the step 309 can be set to one by taking three pixels for the thickness of the vicinity-of-morphology non-evaluation portion 2100p2 and one pixel for the width of the out-of-morphology evaluation portion.

In a case that the deformation change between the photographic image and the design image is small in the morphology portion and morphology not existing in the design image exists in the photographic image in the out-of-morphology non-evaluation portion, this method is particularly effective for the evaluation with ignoring the morphology. Such a case that the photograph of the semiconductor is taken by an optical microscope with a low magnification is often the case as described above, and therefore, this method is effective in the case.

FIG. 12 illustrates four divided regions of a morphology evaluation portion 2200p1, a vicinity-of-morphology non-evaluation portion 2200p2, an out-of-morphology evaluation portion 2200p3, and an out-of-morphology non-evaluation portion 2200p4 as similar to FIG. 11. However, this illustrates a case that two morphology evaluation portions 2200p1 are close to each other so that a connected location of two vicinity-of-morphology non-evaluation portions 2200p2 appears. In the case of the connection of both of them as described above, the out-of-morphology evaluation portion 2200p3 is only an outside region adjacent thereto so that the connected location is avoided.

At the steps 309 and 310 in FIG. 3, the processing of obtaining the similarity degree at the step 310 is performed to the range of the several pixels in periphery of the position having the maximum evaluation value in the matching at the step 308, and the pixel having the highest similarity degree is defined as the most matched (matching) position, so that the value of the position can be the similarity degree to be obtained.

Even if the position in the matching is slightly misaligned in this case, this case has an effect of being able to more accurately evaluate the similarity degree by obtaining a correct position by re-evaluation of the similarity degree.

At the steps 309 and 310 in FIG. 3, in addition to the position having the maximum evaluation value in the matching at the step 308, the processing of obtaining the similarity degree is performed to each of a plurality of positions such as having the second highest evaluation value and the third highest evaluation value, and the position having the highest similarity degree is defined as the most matched (matching) position, so that the value of the position can be the similarity degree to be obtained.

Even if the correct position in the matching is not the first (highest) in the evaluation in this case, the similarity degree of the correct position is high as long as the correct position is the position having the second or third highest evaluation value, and therefore, this case has an effect of being able to evaluate the meaningful similarity degree by obtaining the correct position by recovering an error of the matching.

In addition, at the step 308 in FIG. 3, the evaluation values are obtained in cases of all the overlapping operations so that the template is gradually shifted so as to cover all part of the input image. However, an evaluation value image is generated so as to have an evaluation value as a pixel value of an image position corresponding to an upper-left position on the template to be overlapped with the input image, a filtered evaluation value image is generated by applying a predetermined filter to the evaluation value image, and each evaluation value can be replaced by a pixel value at a corresponding position on the filtered evaluation-value image.

That is, the location having the highest evaluation value can be provided at the position of the overlapping of the highest pixel value on the filtered evaluation value image with the upper-left position of the template.

Further, as the filter applied to the evaluation value image, a smoothing filter whose width is about twice the number of times of the Max3 process performed at the step 306 can be also used.

At the step 310 in FIG. 3, the correlation in the evaluation portion is used for the method of evaluating the similarity degree. In addition, various evaluation indexes adopted in general matching, such as weighted correlation, only a numerator item of the correlation, or an absolute value of a difference between both of the images, can be used.

Second Embodiment (2.1) Configuration, Processing Procedure

A configuration according to a second embodiment is similar to that according to the first embodiment illustrated in FIG. 1.

Figure 13:
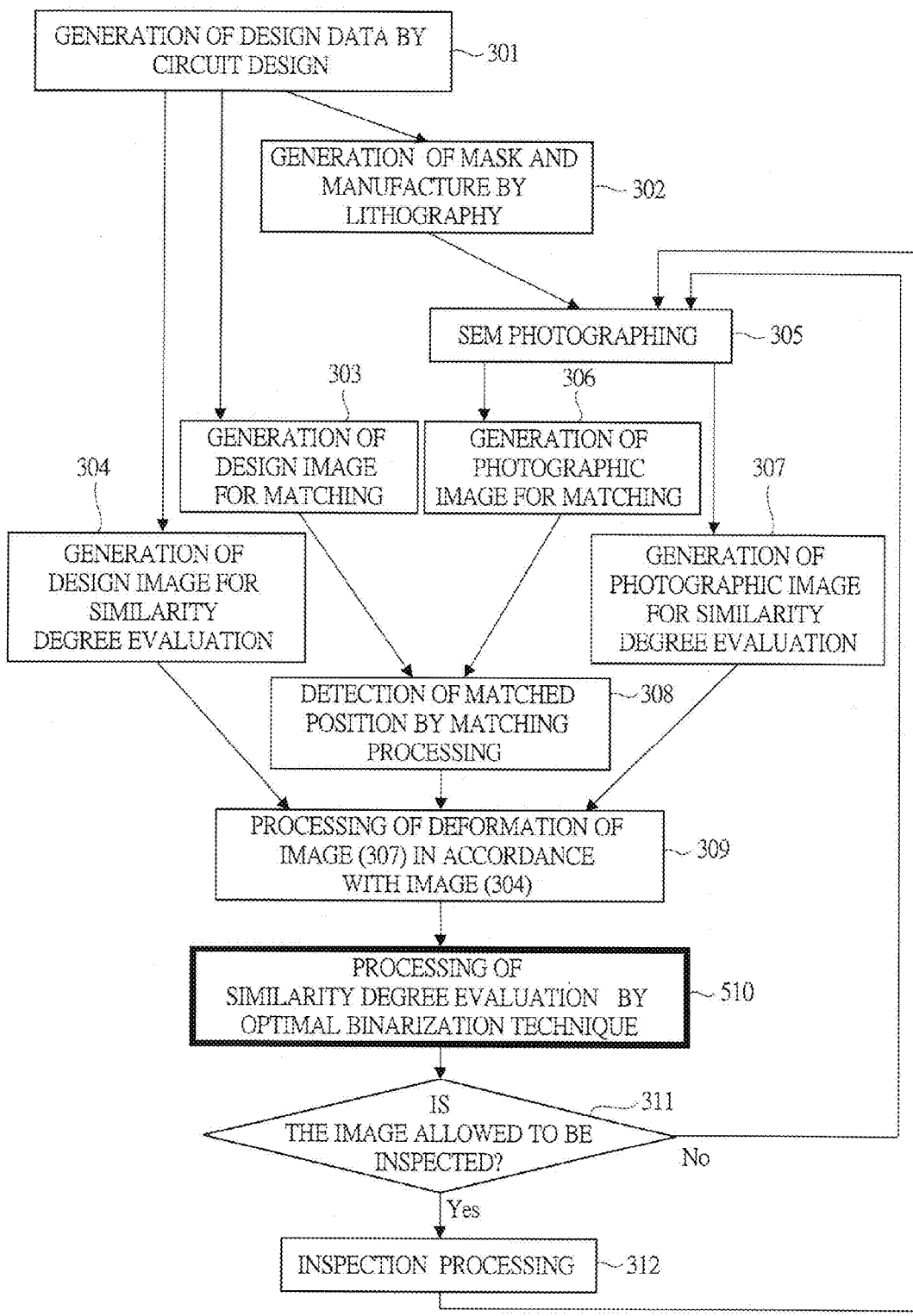
FIG. 13 is a flowchart illustrating a processing procedure of a system including a template matching processing device according to a second embodiment of the present invention.
Figure 14:
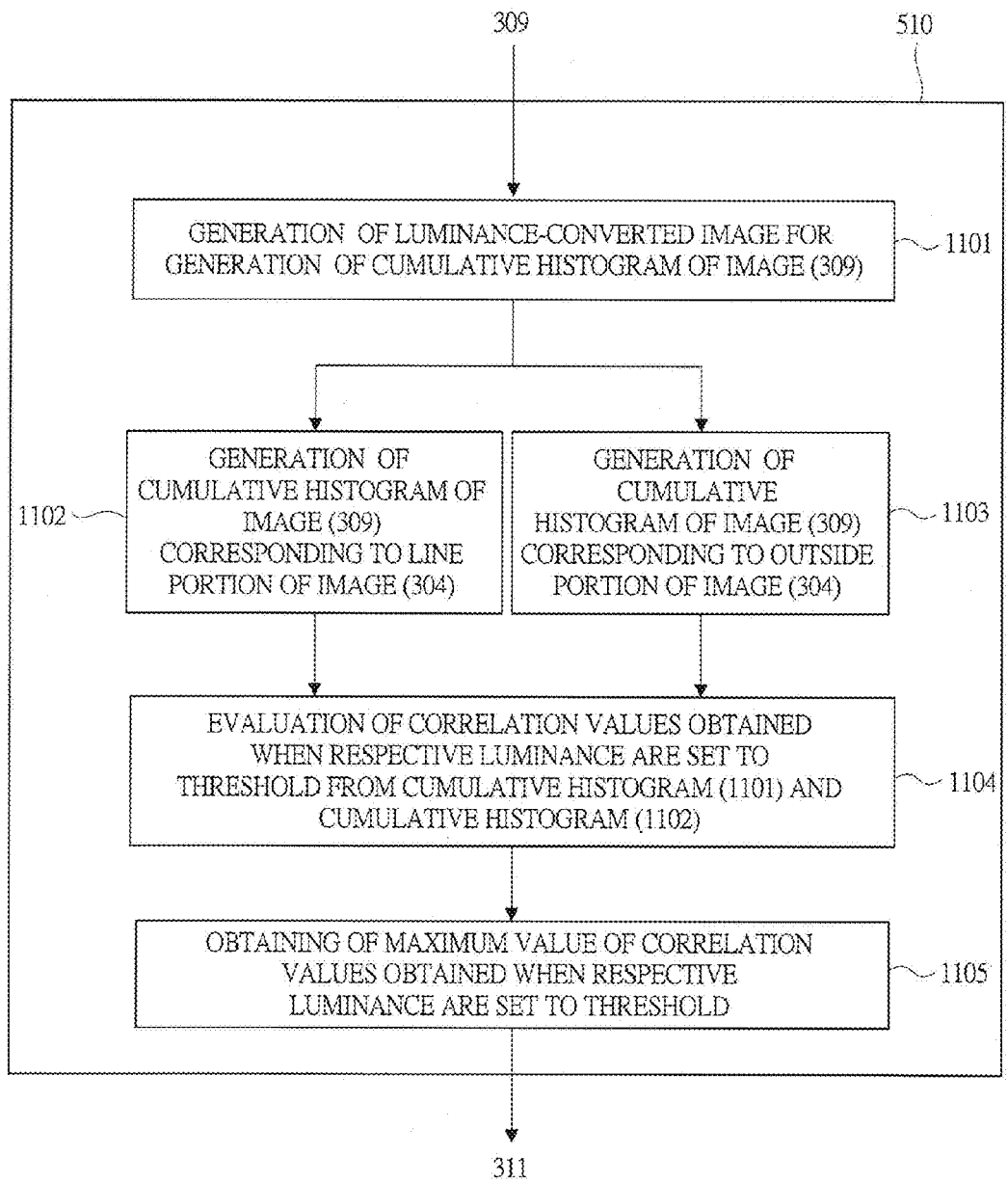
FIG. 14 is a flowchart illustrating a detailed procedure of a feature portion of the template matching processing device according to the second embodiment of the present invention.

With reference to FIGS. 13 and 14, a processing procedure of a system including a template matching processing device according to the second embodiment of the present invention will be explained. FIG. 13 is a flowchart illustrating the processing procedure of the system including the template matching processing device according to the second embodiment of the present invention, and a part illustrated by a thick line in FIG. 13 is a different part from the first embodiment illustrated in FIG. 3. The different part is only a part of [Similarity-Degree Evaluating Unit] at a step 510 in FIG. 13, which corresponds to the step 310 in FIG. 3, and other processing parts are totally the same. FIG. 14 is a flowchart illustrating a detailed procedure of a feature portion of the template matching processing device according to the second embodiment of the present invention, and illustrates details of the processing part at the step 510 in FIG. 13.

Hereinafter, based on FIG. 14, a procedure of the step 510 which is a feature of the second embodiment will be explained. Note that each processing of the step 510 described below is performed by the computer 206.

Step 1101:

A converted image is generated by obtaining the minimum value and the maximum value of the photographic image processed for similarity degree evaluation 307i, performing linear conversion so that the minimum value is 0 and the maximum value is 255, and rounding after the decimal point off to the closest whole number.

Step 1102:

In only a region corresponding to the morphology evaluation portion 304p1, a cumulative histogram "R1" of this converted image is generated. In the region corresponding to the morphology evaluation portion 304p1, a value "R1(c)" at a luminance value "c" of the cumulative histogram R1 represents a total number of pixels each having a value from 0 to c as the pixel value of the design image for similarity degree evaluation 304i.

Step 1103:

In only a region corresponding to the out-of-morphology evaluation portion 304p3, a cumulative histogram "R3" of this converted image is generated.

Similarly, in the region corresponding to the out-of-morphology evaluation portion 304p3, a value "R3(c)" at the luminance value c of the cumulative histogram R3 represents a total number of pixels each having a value from 0 to c as the pixel value of the design image for similarity degree evaluation 304i.

Step 1104:

With using both of the cumulative histograms R1 and R3, a correlation value "v[c]" obtained when the photographic image processed for similarity degree evaluation 307i is binarized so that the value equal to or lower than the threshold c is set to 0 and the value higher than the threshold c is set to 1 is evaluated based on the following (Formula 6) to (Formula 11). The correlation value v[c] is obtained for all values of the c from 0 to 255.

$$v[c]=2\times k\times(b-a)\times(1-k)/(S1\times S3) \quad \text{(Formula 6)}$$

$$S1=2\times \mathrm{sqrt}(k\times(1-k)) \quad \text{(Formula 7)}$$

$$S3=\mathrm{sqrt}((1-b-(a-b)\times k)\times(b+(a-b)\times k)) \quad \text{(Formula 8)}$$

$$k=R1[255]/(R1[255]+R3[255]) \quad \text{(Formula 9)}$$

$$a=R1[c]/R1[255] \quad \text{(Formula 10)}$$

$$b=R3[c]/R3[255] \quad \text{(Formula 11)}$$

Note that the v[c] is the correlation value obtained in the case of the threshold c, the R1[c] is the value (the number of corresponding pixels) at the luminance value c of the above-described cumulative histogram R1, the R3[c] is the value (the number of corresponding pixels) at the luminance value c of the above-described cumulative histogram R3, the R1[255] is the total number of pixels positioned in the morphology evaluation portion, and the R3[255] is the total number of pixels in the out-of-morphology evaluation portion.

Step 1105:

The highest value is selected from the correlation values v[c] so as to be the similarity degree to be obtained.

(2.2) Feature

The second embodiment has a feature that, when the photographic image processed for similarity degree evaluation 307i is binarized based on the threshold c, the correlation with the design image for similarity degree evaluation 304 is obtained within the regions of the morphology evaluation portion 304p1 and the out-of-morphology evaluation portion 304p3 with using the above-described two cumulative histograms.

When the threshold c is provided as a predetermined value, even if the correlation is simply obtained by the formulas expressed by the (Formula 1) to (Formula 5) in the first embodiment, the amount of the computation is not so changed. When the correlation values are obtained by the formulas of (Formula 1) to (Formula 5) for all threshold values from 0 to 255, the amount of the computation is enormous. However, in using the formulas of (Formula 6) to (Formula 11) in the second embodiment, the correlation values v[c] obtained when the threshold c is changed can be evaluated with a less amount of the computation by referring to the values of the histograms which have been generated once.

In the second embodiment, the correlation values v[c] obtained when the threshold c is changed can be evaluated at high speed as described above, and therefore, the second embodiment has an effect of being able to obtain the highest correlation value and the threshold value c at this time at high speed.

Third Embodiment (3.1) Configuration, Processing Procedure

A configuration according to a third embodiment is similar to that according to the first embodiment illustrated in FIG. 1.

Figure 15:
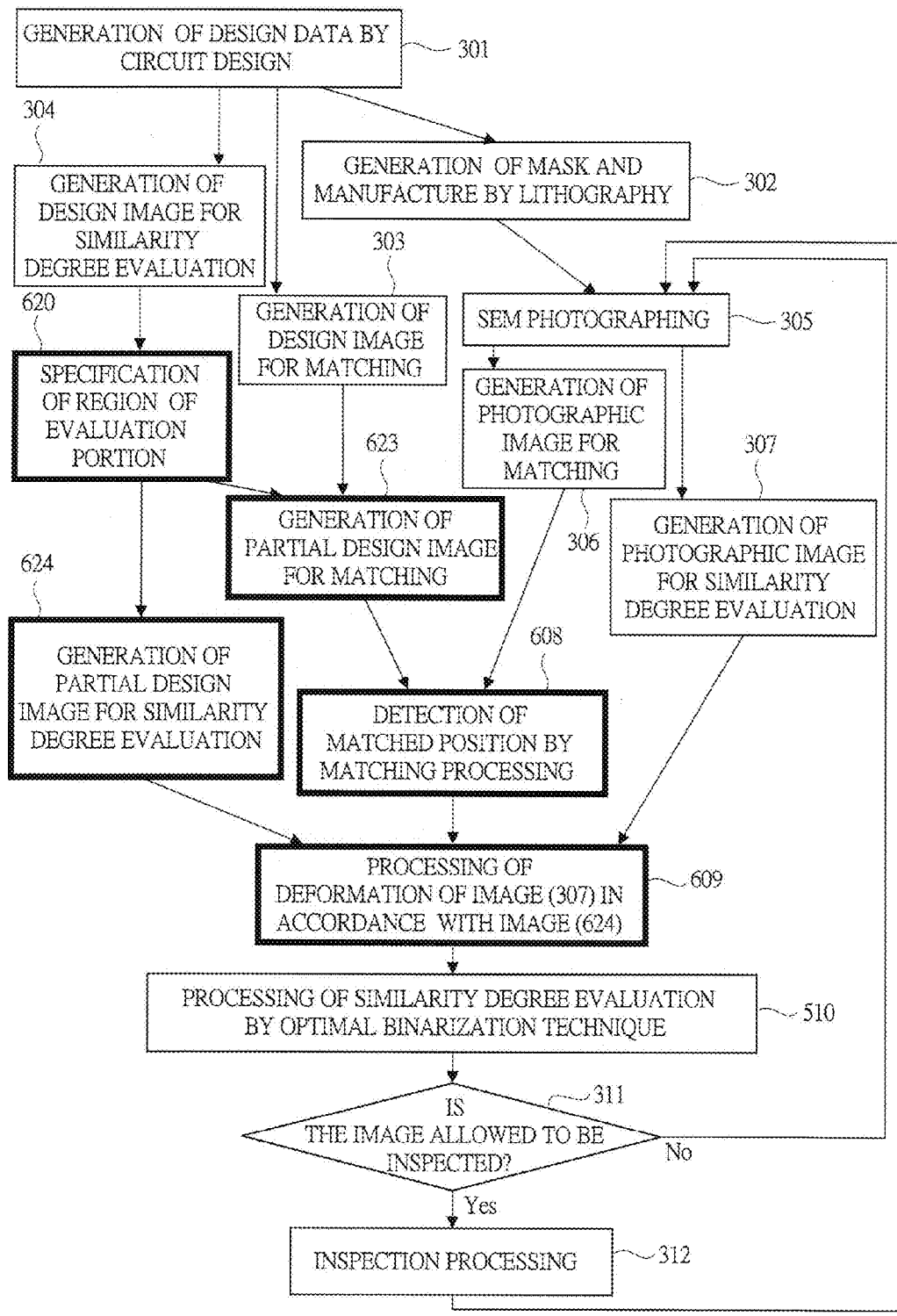
FIG. 15 is a flowchart illustrating a processing procedure of a system including a template matching processing device according to a third embodiment of the present invention.
Figure 16:
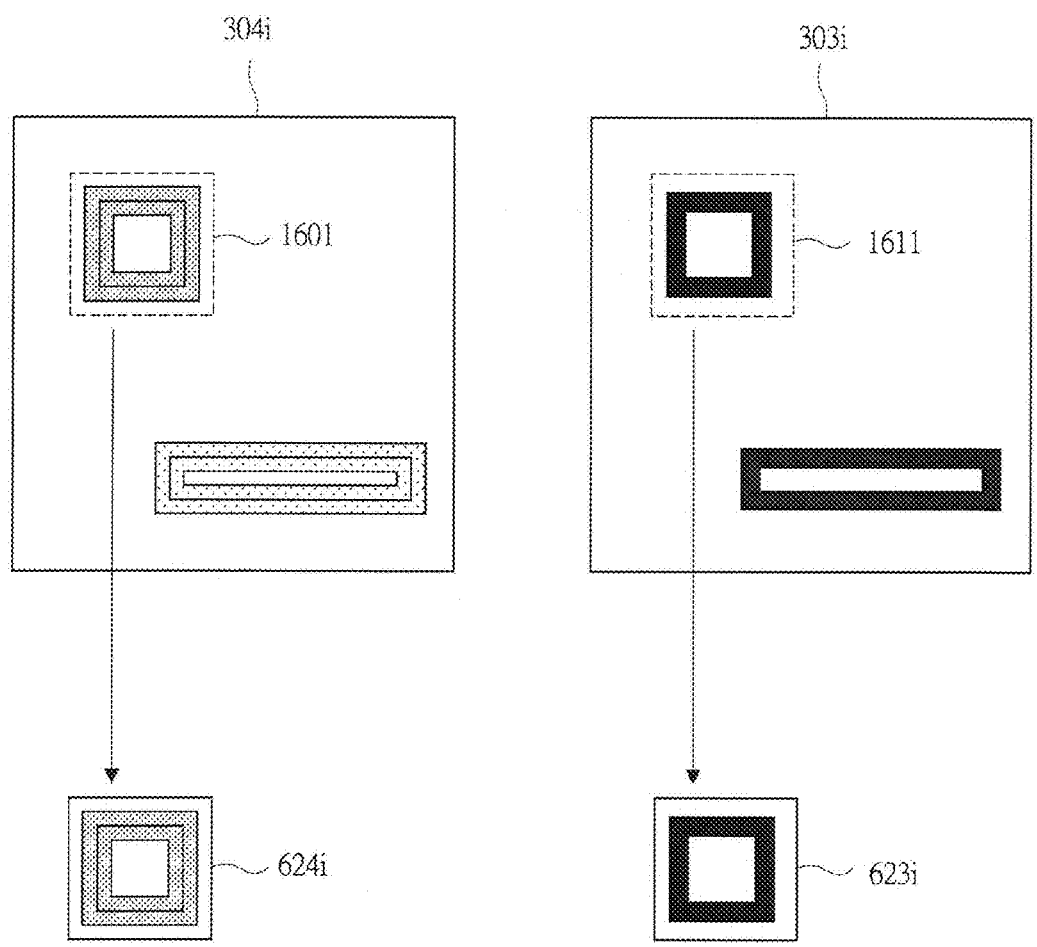
FIG. 16 is a diagram illustrating one example of selecting a portion from a design image of the template matching processing device according to the third embodiment of the present invention.
Figure 17:
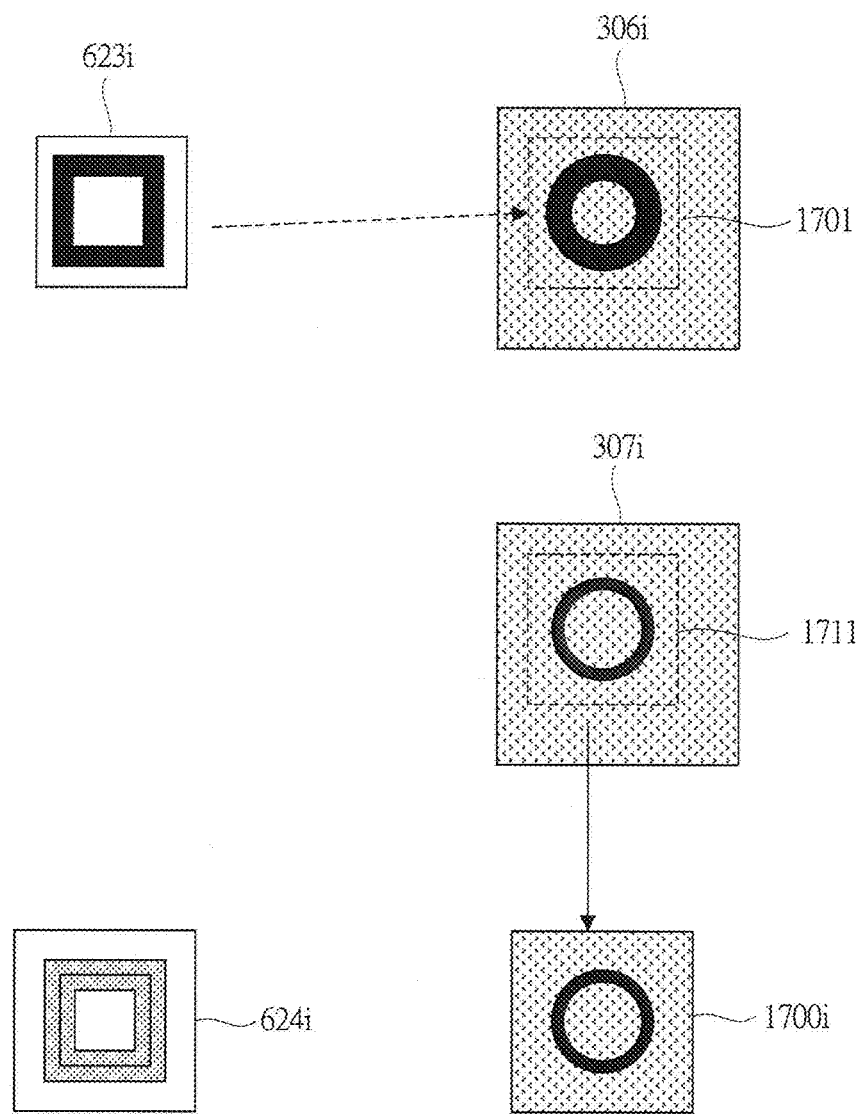
FIG. 17 is a diagram illustrating one example of matching between a design partial image and a photographic image of the template matching processing device according to the third embodiment of the present invention, and a positional correspondence relation thereof.

With reference to FIGS. 15 to 17, a processing procedure of a system including a template matching processing device according to the third embodiment of the present invention will be explained. FIG. 15 is a flowchart illustrating the processing procedure of the system including the template matching processing device according to the third embodiment of the present invention, and parts illustrated by a thick line in FIG. 15 are different parts from the second embodiment illustrated in FIG. 13. The different parts are additional parts of a step 620, a step 623, a step 624, and a step 608 and a replaced part from the step 309 to a step 609, and other processing parts are totally the same as those of the second embodiment. FIG. 16 is a diagram illustrating one example of selecting a portion from a design image of the template matching processing device according to the third embodiment of the present invention, and FIG. 17 is a diagram illustrating one example of matching between a partial design image and a photographic image of the template matching processing device according to the third embodiment of the present invention, and a positional correspondence relation thereof.

Hereinafter, only the different parts from the second embodiment will be explained.

Step 620: (See FIG. 16)

In the designing system 211, a feature portion 1601 of the design image for similarity degree evaluation 304i generated at the step 304 is selected. Accordingly, also on the design image for matching 303i generated at the step 306, a feature portion 1611 located at the same position as the feature portion 1601 of the design image for similarity degree evaluation 304i is selected.

Step 623: (See FIG. 16)

In the designing system 211, the feature portion 1611 of the design image for matching 303i selected at the evaluation step 620 is clipped, so that a partial design image for matching 623i is generated.

Step 624: (See FIG. 16)

In the designing system 211, the feature portion 1601 of the design image for similarity degree evaluation 304i selected at the step 620 is clipped, so that a partial design image for similarity degree evaluation 624i is generated.

Step 608: (See FIG. 17)

In the computer 206, template matching is performed with using the partial design image for matching 623i generated at the step 623 as a template and using the photographic image processed for matching 306i generated at the step 306 as an input image. The method of the template matching has been described at the step 308 in the above-described first embodiment. As a matching position 1701 in FIG. 17, a position having the highest evaluation in the matching is exemplified.

Step 609: (See FIG. 17)

In the computer 206, a corresponding portion 1711 at the same position as the matching position is clipped from the photographic image processed for similarity degree evaluation 307i, so that a clipped image 1700i is generated. Further, the clipped image 1700i is deformed by referring to the partial design image for similarity degree evaluation 624i generated at the step 624. As how to the deformation, the method described at the step 309 in the first embodiment is used.

(3.2) Feature

The third embodiment has a feature that only the feature portion of the design image is clipped for the matching and the evaluation of the similarity degree. In an image containing many similar shape portions to each other, with clipping only the feature portion as described above, the third embodiment has an effect of being able to more correctly perform the matching and more correctly obtain the evaluation index of the similarity degree.

Fourth Embodiment

A configuration according to a fourth embodiment is similar to that according to the first embodiment illustrated in FIG. 1.

Figure 18:
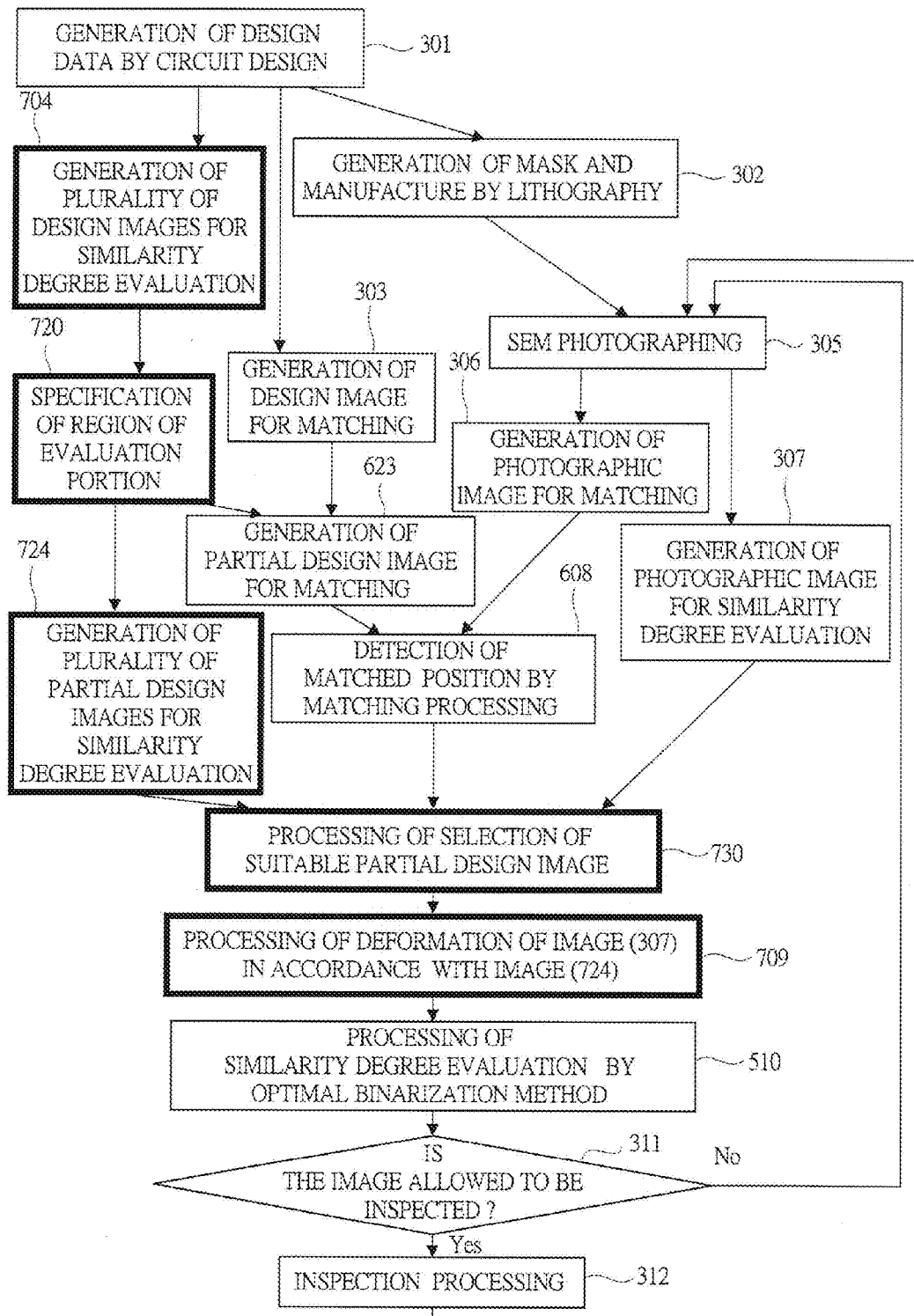
FIG. 18 is a flowchart illustrating a processing procedure of a system including a template matching processing device according to a fourth embodiment of the present invention.
Figure 19:
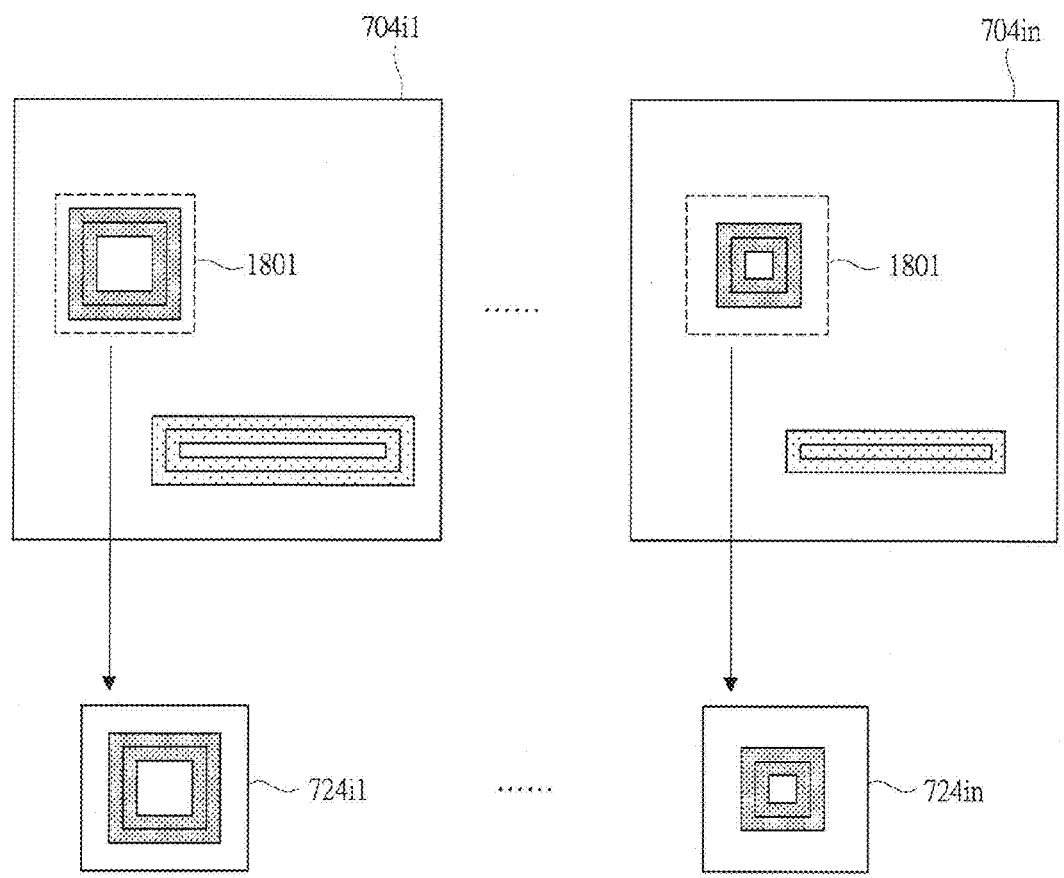
FIG. 19 is a diagram illustrating one example of selecting a portion from a plurality of design images having different sizes of the template matching processing device according to the fourth embodiment of the present invention.

With reference to FIGS. 18 and 19, a processing procedure of a system including a template matching processing device according to the fourth embodiment of the present invention will be explained. FIG. 18 is a flowchart illustrating the processing procedure of the system including the template matching processing device according to the fourth embodiment of the present invention, and parts illustrated by a thick line in FIG. 18 are different parts from the third embodiment illustrated in FIG. 15. The different parts are an additional part of a step 720 and replaced parts from the step 304 to a step 704, from the step 620 to a step 720, from the step 624 to a step 724, and from the step 609 to a step 709, and other processing parts are totally the same as those of the third embodiment. FIG. 19 is a diagram illustrating one example of selecting a portion from a plurality of design images having different sizes of the template matching processing device according to the fourth embodiment of the present invention.

Hereinafter, only the different parts from the third embodiment will be explained.

Step 704: (See FIG. 19)

In the designing system 211, a plurality of design images for similarity degree evaluation having different sizes is produced from the design data. In FIG. 19, the plurality of design images are denoted by reference symbols "704i1" to "704in". The number of steps of changing the size is set to the same number of times of the Max3 process performed at the step 709.

Step 720: (See FIG. 19)

In the designing system 211, in the design images having the different sizes 704i1 to 704in, a featured partial region 1801 is selected, respectively.

Step 724: (See FIG. 19)

In the designing system 211, in the design images having the different sizes 704i1 to 704in, images "724i1" to "724in" obtained by clipping respective partial regions 1801 are generated.

Step 730: [Size Selecting Unit]

In the computer 206, in each of the clipped images 724i1 to 724in of the design images having the different sizes generated at the step 724, a correlation between the photographic image processed for similarity degree evaluation 307i and the design image for similarity degree evaluation 304i is evaluated. The clipped image having the highest correlation value of the respective correlation values is selected so as to be a size-matched image.

Step 709: [Deforming/Similarity-Degree Evaluating Unit]

In the computer 206, by referring to the size-matched clipped image for similarity degree evaluation selected at the step 730, the image 307i processed for similarity degree evaluation is deformed. How to deform the image is the same as that at the step 309.

(4.2) Feature

The fourth embodiment has a feature that the plurality of design images having the different sizes are prepared, the image having the highest matching in the size is detected, and the similarity degree is evaluated by comparison with the detected image. When there is a larger size deviation between the original design image and the photographic image than the deformation of the image performed at the step 309 in FIG. 3, the evaluation can be performed by selecting a design image having a size whose matching is sufficiently expected in a range of the deformation of the image performed at the step 309, and comparing with the selected design image, and therefore, the fourth embodiment has an effect of being able to more stably evaluate the similarity degree.

(4.3) Others

The number of size changing steps for generating the design images having the different sizes performed at the step 704 has been set to be the same as the number of times of the Max3 process performed at the step 709 in the above manner. However, when the photographic image is thick, the number of size changing steps may be increased by a degree of the thick.

At the step 608, the matching between the partial design image for matching 623i and the photographic image for matching 306i has been performed. However, another method may be used, in which a plurality of partial design images for matching having different sizes are prepared, each of them is matched with the photographic image processed for matching 306i, a size having the highest evaluation value is selected, and the similarity degree is evaluated for a design image having the size.

Alternatively, still another method may be used, in which the number of changing steps for obtaining the size of the design image for matching is increased, a rough size is once detected, and then, only a peripheral size of the rough size is selected at the step 720 so as to more minutely find a size-matched image, and the similarity degree is evaluated with the size-matched image. This case has an effect of stable matching, and therefore, has an effect of being able to frequently evaluate the meaningful similarity degree.

Fifth Embodiment)

(5.1) Configuration, Processing Procedure

A configuration according to a fifth embodiment is similar to that according to the first embodiment illustrated in FIG. 1.

Figure 20:
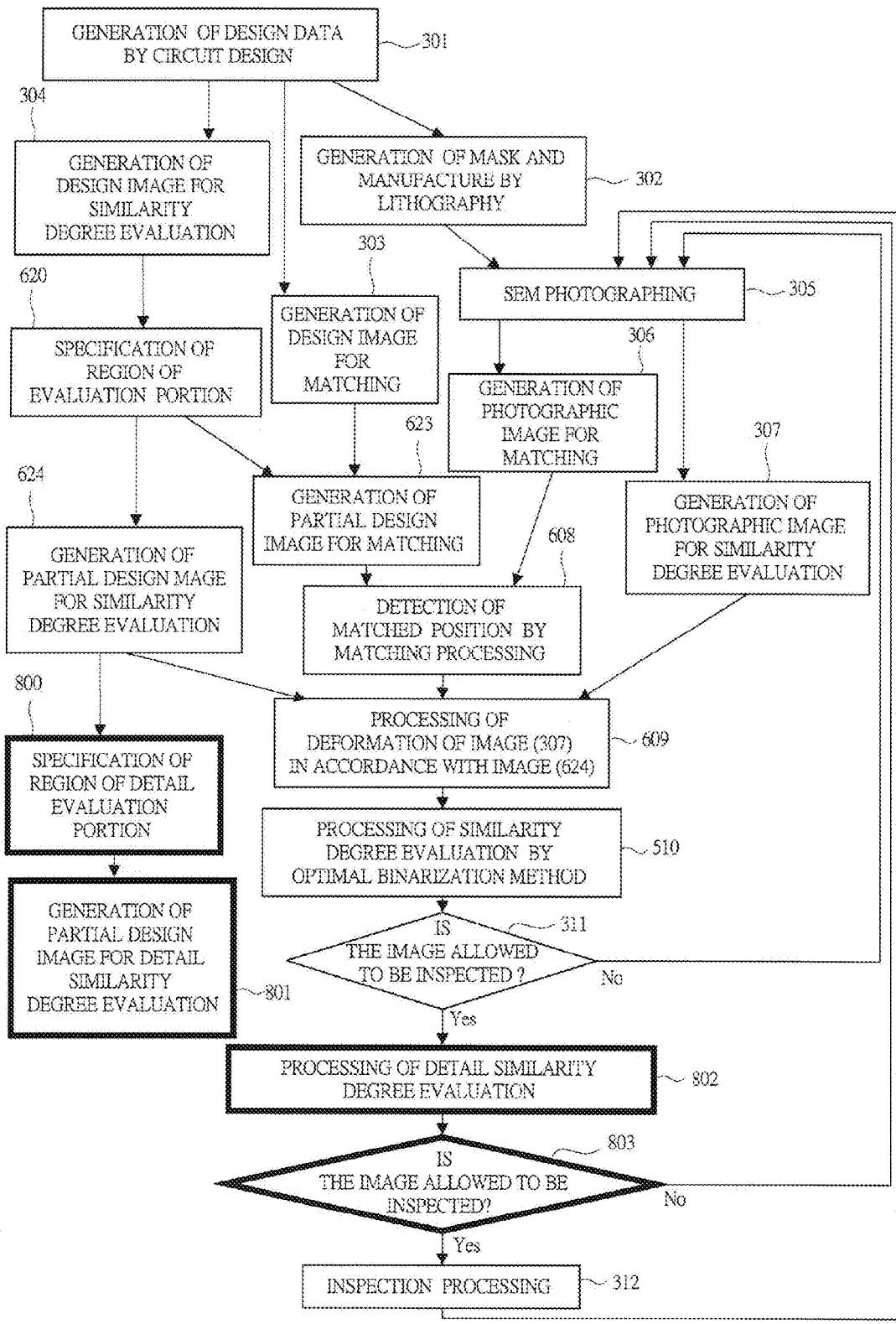
FIG. 20 is a flowchart illustrating a processing procedure of a system including a template matching processing device according to a fifth embodiment of the present invention.
Figure 21:
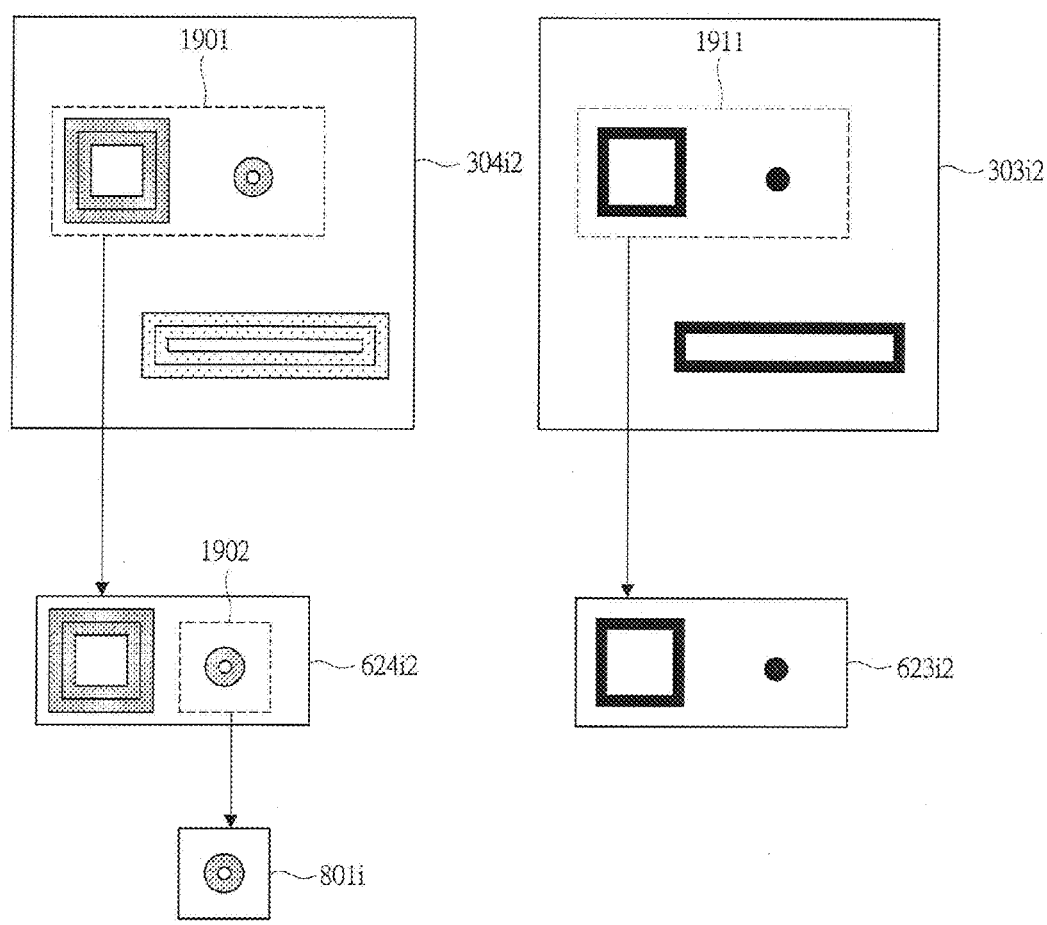
FIG. 21 is a diagram illustrating one example of selecting a first portion and a second portion from a design image of the template matching processing device according to the fifth embodiment of the present invention.

With reference to FIGS. 20 and 21, a processing procedure of a system including a template matching processing device according to the fifth embodiment of the present invention will be explained. FIG. 20 is a flowchart illustrating the processing procedure of the system including the template matching processing device according to the fifth embodiment of the present invention, and parts illustrated by a thick line in FIG. 20 are different parts from the third embodiment illustrated in FIG. 15. The different parts are additional parts of a step 800, a step 801, a step 802, and a step 803, and other processing parts are totally the same as those of the third embodiment. FIG. 21 is a diagram illustrating one example of selecting first and second portions from a design image of the template matching processing device according to the fifth embodiment of the present invention.

Hereinafter, only the different parts from the third embodiment will be explained.

Regarding Input Image at Step 800: (See FIG. 20)

In the designing system 211, a first partial design image for similarity degree evaluation 624i2 is generated by specifying a first feature portion 1901 on a design image for similarity degree evaluation 304i2 at the step 620 and clipping the portion at the step 624.

Further, at the step 623, also from the design image for matching 303i2, a partial design image for matching 623i2 is generated so as to be clipped in a partial region 1911 at the same position as the partial region 1901. While the partial design image for matching 623i2 is to be an input image at the step 608, the first partial design image for similarity degree evaluation 624i2 is to be an input image at the step 800.

Step 800: (See FIG. 21)

In the designing system 211, a portion 1902 whose similarity degree is desired to be evaluated is selected as a second specified region from the first partial design image for similarity degree evaluation 624i2.

Step 801: (See FIG. 21)

In the designing system 211, the portion 1902 whose similarity degree is desired to be evaluated is clipped from the first partial design image for similarity degree evaluation 624i2, so that a second partial design image for similarity degree evaluation 801i is generated.

Step 802: [Detail Similarity-Degree Evaluating Unit] (See FIG. 21)

In the computer 206, a partial image at a corresponding position on the photographic image for similarity degree evaluation 307i is deformed with referring to the second partial design image 801i for similarity degree evaluation, and the similarity degree between this deformed partial image and the second partial design image for similarity degree evaluation 801i is evaluated. The methods of the deformation and the similarity-degree evaluation are the same as those at the step 609.

Note that the corresponding position between both of them is obtained from the position having the highest evaluation in the matching processing at the step 608 and the position where the portion 1902 whose similarity degree is desired to be evaluated has been specified at the step 800.

Step 803:

In the computer 206, if the similarity degree which has been obtained at the step 802 is equal to or higher than a predetermined value, it is regarded that the position is matched with the correct position, the process proceeds to the inspecting processing at the step 312. If not, the position is not the correct position, and therefore, it is regarded that this semiconductor is not suitable for the inspection, and the process proceeds to the step 305 so as to take a photograph of a next semiconductor.

(5.2) Feature

The fifth embodiment has a feature that the matching and the evaluation of the similarity degree are performed once at a site selected as the feature site, and then, a portion whose similarity degree is desired to be evaluated in more detail is selected and is re-evaluated for the similarity degree.

In a semiconductor manufacturing step, a plurality of layers are formed, and there are some case that an overlapping state between an upper layer and a lower layer is not as designed, which results in slight shift of the position. In such a case, this method has such an advantage that an index of the similarity degree with higher accuracy can be obtained by selecting only data of a specific layer to perform the re-evaluation.

(5.3) Others

The similarity degree has been evaluated and determined at the step 609, the step 510, and the 311. However, with eliminating these steps, the processing of evaluating the similarity degree of the detailed portion can be performed at the step 802. This case has such an advantage that only the site whose similarity degree is desired to be evaluated can be simply evaluated.

At the step 802 and 803, the corresponding position is defined from the position having the highest evaluation in the matching processing at the step 608 and the position where the portion 1902 whose similarity degree is desired to be evaluated is specified at the step 800, so that the image is deformed and the similarity degree is evaluated. However, the similarity degrees are also obtained for all positions each shifted by predetermined pixels from the other, the position having the highest similarity degree from positions also including these positions is defined as the matching position, so that the similarity degree at the position can be the similarity degree to be obtained.

This case has such an advantage that a location most matched with the interesting site whose similarity degree is desired to be evaluated can be detected, which results in obtaining a more accurate similarity degree.

Sixth Embodiment

(6.1) Configuration, Processing Procedure

A configuration according to a sixth embodiment is similar to that according to the first embodiment illustrated in FIG. 1.

Figure 22:
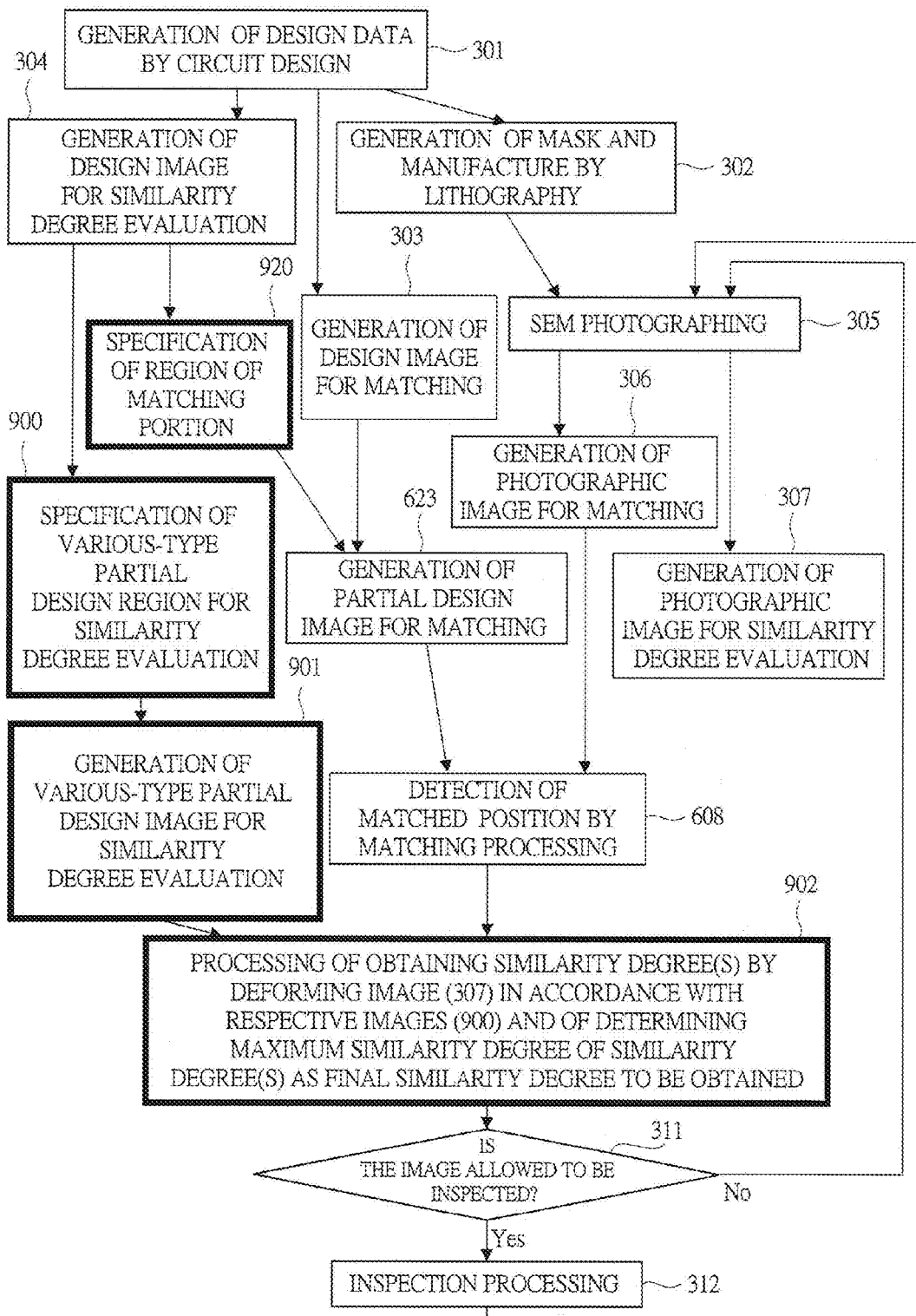
FIG. 22 is a flowchart illustrating a processing procedure of a system including a template matching processing device according to a sixth embodiment of the present invention.
Figure 23:
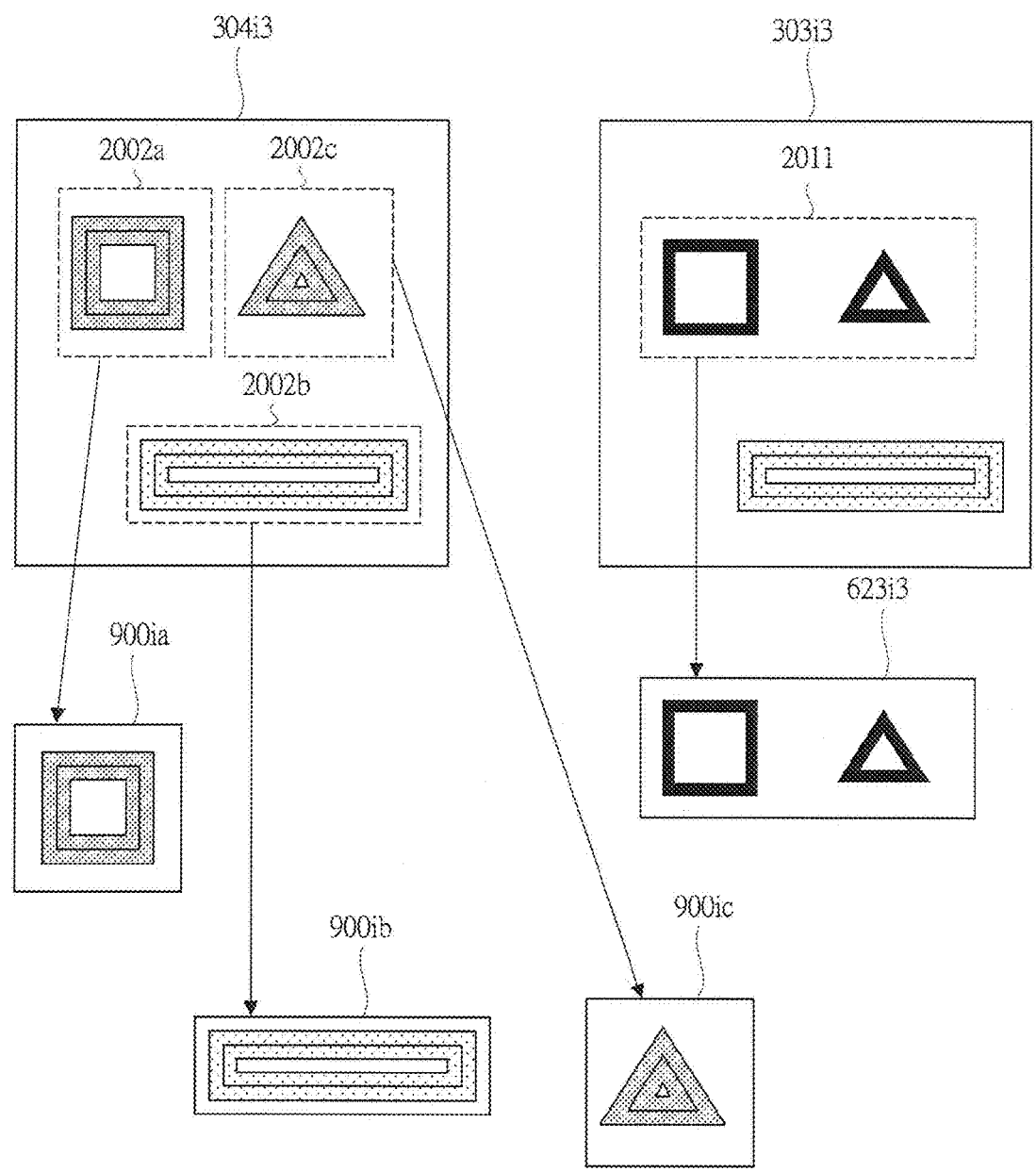
FIG. 23 is a diagram illustrating one example of selecting a plurality of partial images from a design image of the template matching processing device according to the sixth embodiment of the present invention.

With reference to FIGS. 22 and 23, a processing procedure of a system including a template matching processing device according to the sixth embodiment of the present invention will be explained. FIG. 22 is a flowchart illustrating the processing procedure of the system including the template matching processing device according to the sixth embodiment of the present invention, and parts illustrated by a thick line in FIG. 22 are different parts from the third embodiment illustrated in FIG. 15. The different parts are additional parts of a step 920, a step 900, a step 901, and a step 902, and other processing parts are totally the same as those of the third embodiment. FIG. 23 is a diagram illustrating one example of selecting a plurality of partial images from a design image of the template matching processing device according to the sixth embodiment of the present invention.

Hereinafter, only the different parts from the third embodiment will be explained.

Step 920: (See FIG. 23)

In the designing system 211, a featured partial region 2011 on a design image for matching 303$i$3 is specified. Then, the featured partial region 2011 on the design image for matching 303$i$3 is clipped at the step 623, so that a partial design image for matching 623$i$3 is generated.

Step 900: (See FIG. 23)

In the designing system 211, a plurality of featured partial regions 2002$a$, 2002$b$, and 2002$c$ on a design image for similarity degree evaluation 304$i$3 are specified. The number to be specified depends on the number of featured regions, and is selected appropriately.

Step 901: (See FIG. 23)

In the designing system 211, the plurality of featured partial regions 2002$a$, 2002$b$, and 2002$c$ are clipped from the design image for similarity degree evaluation 304$i$3, so that a plurality of partial design regions for similarity degree evaluation 900$ia$, 900$ib$, and 900$ic$ are generated. Such an image is generated for all the partial regions specified at the step 900.

Step 902: [Plural Selection Type Similarity-Degree Evaluating Unit] (See FIG. 23)

In the computer 206, for all the partial design images for similarity degree evaluation 900$ia$, 900$ib$, and 900$ic$ generated at the step 901, the image processed for similarity degree evaluation 307$i$ is deformed to obtain the similarity degrees. The highest one is selected from these similarity degrees, and is the similarity degree to be obtained.

The method of evaluating the similarity degree is similar to those at the steps 609 and 510. Further, the respective corresponding positions are defined from correspondence relations between the matching position with the partial design image for matching 623$i$3 at the step 608 and the positions on the partial regions 2002$a$, 2002$b$, and 2002$c$ at the clipping of the respective partial design images 900$ia$, 900$ib$, and 900$ic$.

(6.2) Feature

The sixth embodiment has a feature that the plurality of featured sites are specified to evaluate the similarity degrees.

In a semiconductor manufacturing step, a plurality of layers are formed, and there is such a case that a lower layer is covered by an upper layer so as not be viewed, and therefore, this results in such a case that, even if the featured site is specified on the design image, the site cannot be viewed on the photographic image. Even such a case has an advantage that the similarity degree can be evaluated more stably because, by specifying the plurality of featured portions so as to evaluate the similarity degrees, it is expected that any one of them is matched.

Seventh Embodiment (7.1) Configuration, Processing Procedure

A configuration according to a seventh embodiment is similar to that according to the first embodiment illustrated in FIG. 1.

Figure 24:
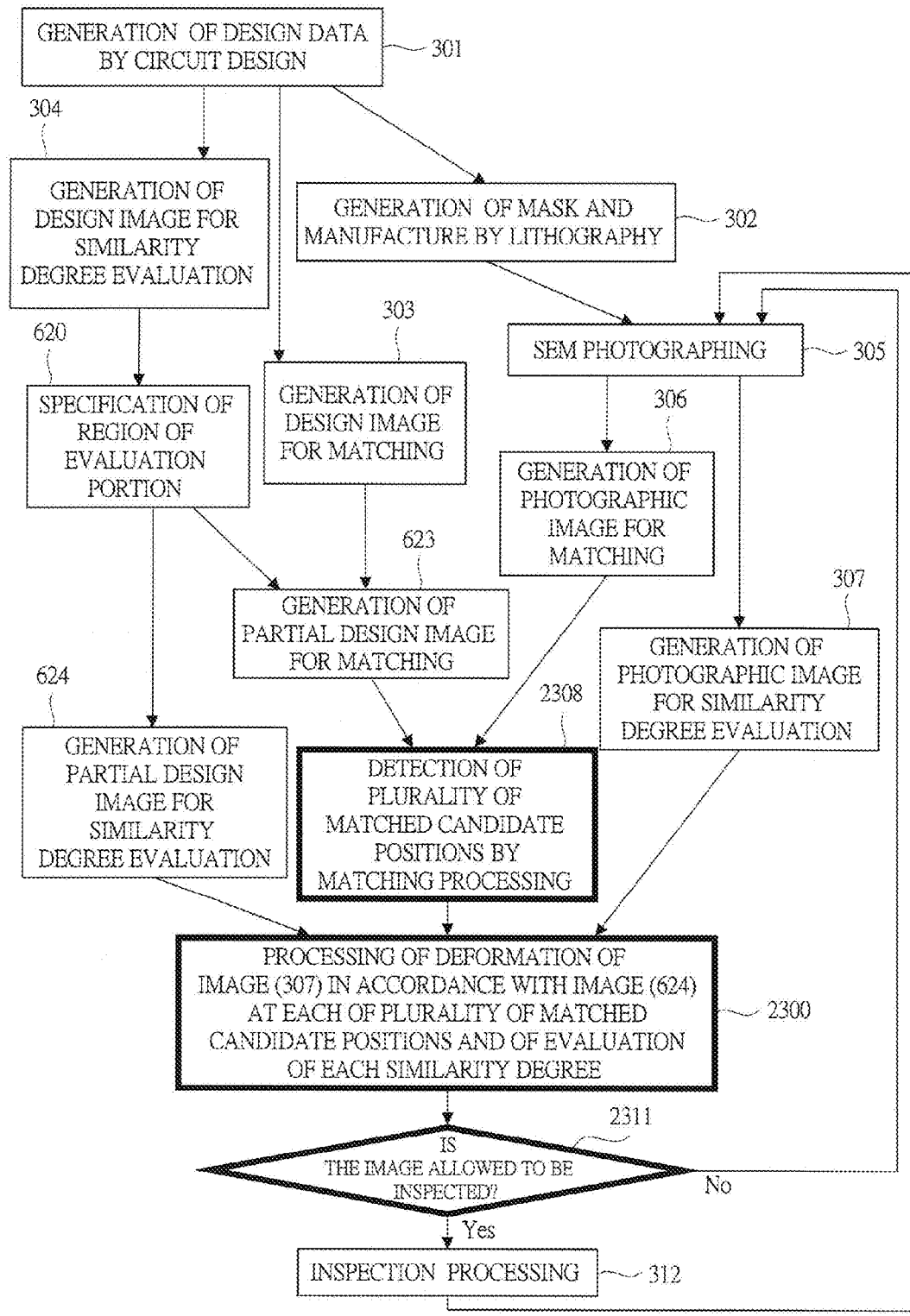
FIG. 24 is a flowchart illustrating a processing procedure of a system including a template matching processing device according to a seventh embodiment of the present invention.

With reference to FIG. 24, a processing procedure of a system including a template matching processing device according to the seventh embodiment of the present invention will be explained. FIG. 24 is a flowchart illustrating the processing procedure of the system including the template matching processing device according to the seventh embodiment of the present invention, and parts illustrated by a thick line in FIG. 24 are different parts from the third embodiment illustrated in FIG. 15. The different parts are replaced parts from the step 608 to a step 2308, from the steps 609 and 510 to a step 2300, and from the step 311 to a step 2311, and other processing parts are totally the same as those of the third embodiment.

Hereinafter, only the different parts from the third embodiment will be explained.

Step 2308:

This processing is totally the same as that at the step 608. Template matching is performed between the design image for matching 303$i$ generated at the step 303 and the photographic image processed for matching 306$i$ generated at the step 306, and correlation values at all positions obtained when both the images are overlapped with each other are obtained as evaluation values.

In the third embodiment, only the position having the highest evaluation value is evaluated in a subsequent processing. However, in the seventh embodiment, the positions having the second highest evaluation value and the third highest evaluation value are also referred in a subsequent step 2300.

Step 2300: [Plural Evaluating Unit]

At each of the positions having the evaluation values up to the third highest evaluation value obtained at the step 2308, the photographic image for similarity degree evaluation 307$i$ is deformed so as to obtain the similarity degree. As a method of obtaining the similarity degree, the same methods of the deformation and obtaining the similarity degree at the above-described steps 609 and 510 are used.

Note that the position having the second highest evaluation value is searched so as not to evaluate evaluation values at predetermined positions in periphery of the position having the highest evaluation value, and further, the position having the third highest evaluation value is searched so as not to include evaluation values at predetermined positions in periphery of the position having the second highest evaluation value.

Step 2311: [Determining Unit]

If the highest value in the similarity degree of the three similarity degrees obtained at the above-described step 2300 is higher than a predetermined value, and besides, if a difference between the highest value and the second highest value in the similarity degree is higher than a predetermined value, it is regarded that the position is matched with the correct position, so that the process proceeds to the step 312. If not, the process returns to the step 305.

(7.2) Feature

The seventh embodiment supports a possibility that the correct position is not the position having the highest evaluation value in the matching but the position having the second or third highest evaluation value, which is a possibility that the correct position is the position having the highest similarity degree of the similarity degrees evaluated up to the third highest evaluation value.

Further, if the correct position is not included in the positions having up to the third highest evaluation value in the matching, the similarity degrees at the highest matching value and the second highest value have frequently similar values to each other. If the correct position is included in the positions having up to the third highest evaluation value in the matching, in addition to obtaining the highest similarity degree at any of the positions, each difference in the similarity degree between the position and other positions is larger than that in the case that the correct position is not included therein.

The seventh embodiment has a feature whether or not the correct position has been detected with utilizing the above-described characteristics, and has such an advantage that the similarity degree can be evaluated more stably.

(7.3) Others

At the above-described step 2300, the similarity degrees having up to the third highest evaluation value in the matching are evaluated. However, all the similarity degrees having up to a predetermined rank order value such as up to the fifth highest evaluation value can be also evaluated.

Also in the sixth embodiment, the similarity degrees of the above-described plurality of partial design images are similarly obtained for all the evaluation values up to the predetermined rank order in the matching, and the process proceeds to the step 2311 so as to perform a final determination with using the similarity degree at each rank order as the similarity-degree maximum value of the partial design image having the rank order.

Further, as an object to be evaluated at the above-described step 2300, various objects can be defined, the object being all positions when an evaluation value in the matching is equal to or larger than a predetermined value, being a position(s) having an evaluation value equal to or larger than a predetermined value and a rank order thereof within a predetermined rank order, or being to take up to the second highest evaluation value for the evaluation if there are less than two positions having the evaluation value equal to or larger than a predetermined value.

Still further, such a method can be also adopted, that the determination criteria at the above-described step 2311 is only a difference between the highest value and the second highest value in the similarity degree, and, if the difference is higher than a predetermined value, the position is regarded as the correct position, so that the process proceeds to the step 321, and, if not, the process returns to the step 305. This case corresponds to such a method that a predetermined threshold which is provided to the highest evaluation value at the above-described step 2311 is set to be lower so that all cases are substantially passed.

In addition, such a method can be adopted, that the determination criteria at the above-described step 2311 is to check whether or not the similarity degrees having up to a predetermined rank order such as the fifth highest evaluation value are higher than a predetermined value, and besides, whether or not a predetermined positional relation is seen in a positional relation among them.

In addition, in a case that similar morphology periodically exists, if existence of the morphology at a terminal end position of the period can be confirmed by a high similarity degree, and besides, if no existence of the morphology at a position where the morphology is expected to appear can be confirmed by a low similarity degree on the assumption that the morphology continues to periodically appear, it can be determined that the position is the correct position.

In the foregoing, the invention made by the present inventors has been concretely described based on the embodiments. However, it is needless to say that the present invention is not limited to the foregoing embodiments and various modifications and alterations can be made within the scope of the present invention.

INDUSTRIAL APPLICABILITY

The present invention relates to a template matching processing device which performs template matching, and can be widely applied in a case that a design image simulating a design or morphology and a photographic image thereof are matched with each other.

SYMBOL EXPLANATION

10 . . . CPU, 11 . . . ROM, 12 . . . RAM, 13 . . . HDD, 14 . . . user interface, 15 . . . communication interface, 201 . . . stage, 202 . . . inspection object, 203 . . . electron gun, 204 . . . secondary electron detection unit, 205 . . . imaging unit, 206 . . . computer, 207 display device, 210 . . . network, 211 . . . designing system, 212 . . . manufacturing system, 213 . . . inspecting system, 301*i* . . . example of design image, 301*p1* . . . example of morphology portion, 301*p2* . . . example of background portion, 303*i* . . . example of design image for matching, 303*p1* . . . example of matching morphology portion, 303*p2* . . . example of matching background portion, 304*i* . . . example of design image for similarity degree evaluation, 304*p1* . . . example of morphology evaluation portion, 304*p2* . . . example of vicinity-of-morphology non-evaluation portion, 304*p3* . . . example of out-of-morphology evaluation portion, 305*i* . . . example of photographic image for matching, 305*p1* . . . example of white band portion, 305*p2* . . . example of background portion, 306*i* . . . example of photographic image processed for matching, 306*p1* . . . example of white band portion, 306*p2* . . . example of background portion, 307*i* . . . example of photographic image for similarity degree evaluation, 307*p1* . . . example of white band portion, 307*p2* . . . example of background portion, 1401 . . . example of matching position, 1402 . . . example of corresponding position on design image for similarity degree evaluation, 101*i* . . . example of clipped design image, 102*i* . . . example of image during processing, 103*i* . . . example of image during processing, 104*i* . . . example of image during processing, 309*i* . . . example of deformation processed image, 1601 . . . example of specified position, 1611 . . . example of corresponding position, 623*i* . . . example of partial design image to be matched, 624*i* . . . example of first partial design image for similarity degree evaluation, 1701 . . . example of matching position, 1711 . . . example of corresponding position, 1700*i* . . . clipped image of photographic image for similarity degree evaluation, 1801 . . . example of specified position, 724*i*1 . . . example of partial design image for similarity degree evaluation, 724*in* . . . example of partial design image for similarity degree evaluation, 1901 . . . example of first specified position, 1911 . . . example of corresponding position, 1902 . . . example of portion whose similarity degree is desired to be evaluated, 623*i*2 . . . example of partial design image for matching, 624*i*2 . . . example of first partial design image for similarity degree evaluation, 801*i* . . . example of second partial design image for similarity degree evaluation, 2011 . . . example of specified position, 2002*a* . . . example of specified position, 2002*b* . . . example of specified position, 2002*c* . . . example of specified position, 623*i*3 . . . example of partial design image for matching, 900*ia* . . . example of partial design image for matching, 900*ib* . . . example of partial design image for matching, 900*ic* . . . example of partial design image for matching, 2100*p1* . . . example of morphology evaluation portion, 2100*p2* . . . example of vicinity-of-morphology non-evaluation portion, 2100*p3* . . . example of out-of-morphology evaluation portion, 2100*p4* . . . example of out-of-morphology non-evaluation portion, 2200p1 . . . example of morphology evaluation portion, 2200p2 . . . example of vicinity-of-morphology non-evaluation portion, 2200p3 . . . example of out-of-morphology evaluation portion, 2200p4 . . . example of out-of-morphology non-evaluation portion

The invention claimed is:

1. A template matching processing device for comparing an input image with a template, comprising:
   a matching unit for obtaining a positional correspondence relation between a design image for matching generated from a design data for manufacturing a desired product and a photographic image obtained by taking a photograph of the product manufactured based on the design data, which is taken by a predetermined photographing device; and
   a similarity-degree evaluating unit, by referring to a design image for similarity degree evaluation generated from the design data and based on the positional correspondence relation defined by the matching unit, for generating a cumulative histogram of the photographic image or an image obtained by applying a predetermined processing to the photographic image at a corresponding position of a morphology evaluation portion on the design image for similarity degree evaluation and generating a cumulative histogram of the photographic image or an image obtained by applying a predetermined processing to the photographic image at a corresponding position of an out-of-morphology evaluation portion on the design image for similarity degree evaluation, and for evaluating a desired similarity degree between the photographic image and the design image for similarity degree evaluation by referring to both of the histograms.

2. The template matching processing device according to claim 1, further comprising:
   a size selecting unit for selecting a design image having a size whose correspondence relation with the photographic image is the closest at a matching position defined by the matching unit, which is selected from a plurality of design images having different sizes generated from the design data; and
   a deforming/similarity-degree evaluating unit for deforming the photographic image by referring to the design image for similarity degree evaluation having the size selected by the size selecting unit among the plurality of design images for similarity degree evaluation having different sizes generated from the design data, and for evaluating a desired similarity degree.

3. The template matching processing device according to claim 1, further comprising:
   a plural selection type similarity-degree evaluating unit, by referring to a plurality of partial design images for similarity degree evaluation generated from the design data and based on the positional correspondence relation defined by the matching unit, for evaluating a desired similarity degree for each of the partial design images for similarity degree evaluation, and for taking the maximum similarity degree among the desired similarity degrees as a final similarity degree to be obtained.

4. The template matching processing device according to claim 1, further comprising:
   a deforming/similarity-degree evaluating unit for deforming the photographic image by referring to a design image for similarity degree evaluation generated from the design data and based on the positional correspondence relation defined by the matching unit, and for evaluating a desired similarity degree between the photographic image and the design image for similarity degree evaluation; and
   a plural evaluating unit for making the deforming/similarity-degree evaluating unit function as evaluating similarity degrees by referring to the matching unit at a plurality of positions having the similarity degrees whose rank orders are within a predetermined rank order or the similarity degrees equal to or larger than a predetermined threshold.

5. The template matching processing device according to claim 4,
   wherein the template matching processing device includes a determining unit for determining that a position having the largest value is a correct position if the largest value of the plurality of similarity degrees obtained by the plural evaluating unit is larger than a predetermined value, and besides, if a difference between the largest value and the second largest value is larger than a predetermined value.

* * * * *